(12) United States Patent
Bower et al.

(10) Patent No.: US 11,742,471 B2
(45) Date of Patent: Aug. 29, 2023

(54) SURFACE-MOUNTABLE PIXEL PACKAGES AND PIXEL ENGINES

(71) Applicant: X Display Company Technology Limited, Dublin (IE)

(72) Inventors: Christopher Andrew Bower, Raleigh, NC (US); Matthew Alexander Meitl, Durham, NC (US); Glenn Arne Rinne, New Hill, NC (US); Justin Walker Brown, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 150 days.

(21) Appl. No.: 17/372,335

(22) Filed: Jul. 9, 2021

(65) Prior Publication Data

US 2021/0376213 A1     Dec. 2, 2021

Related U.S. Application Data

(63) Continuation of application No. 16/810,775, filed on Mar. 5, 2020, now Pat. No. 11,094,870.
(Continued)

(51) Int. Cl.
    *H01L 33/62*      (2010.01)
    *H01L 25/075*      (2006.01)
    (Continued)

(52) U.S. Cl.
    CPC .............. *H01L 33/62* (2013.01); *B41F 16/00* (2013.01); *H01L 25/0753* (2013.01);
    (Continued)

(58) Field of Classification Search
    CPC ........... H01L 25/0753; H01L 21/67144; B41F 16/006; B65G 47/90
See application file for complete search history.

(56) References Cited

U.S. PATENT DOCUMENTS

| | | |
|---|---|---|
| 5,739,800 A | 4/1998 | Lebby et al. |
| 6,142,358 A | 11/2000 | Cohn et al. |

(Continued)

OTHER PUBLICATIONS

Bower, C. A. et al., Emissive displays with transfer-printed assemblies of 8 μm×15 μm inorganic light-emitting diodes, Photonics Research, 5(2):A23-A29, (2017).
(Continued)

*Primary Examiner* — Antonio B Crite
(74) *Attorney, Agent, or Firm* — Choate, Hall & Stewart LLP; Michael D. Schmitt

(57) ABSTRACT

A method of making a surface-mountable pixel engine package comprises providing an array of spaced-apart conductive pillars and an insulating mold compound laterally disposed between the conductive pillars on a substrate together defining a planarized surface. Pixel engines comprising connection posts are printed to the conductive pillars so that each of the connection posts is in electrical contact with one of the conductive pillars. The pixel engines are tested to determine known-good pixel engines. An optically clear mold compound is provided over the planarized surface and tested pixel engines. Optically clear mold compound is adhered to a tape and the substrate is removed. The optically clear mold compound, the insulating mold compound, the conductive pillars, the optically clear mold compound, and the tested pixel engines are singulated to provide pixel packages that comprise the pixel engines and the known-good pixel engines are transferred to a reel or tray.

18 Claims, 37 Drawing Sheets

Related U.S. Application Data

(60) Provisional application No. 62/817,491, filed on Mar. 12, 2019.

(51) Int. Cl.
  *H01L 33/54* (2010.01)
  *H01L 33/60* (2010.01)
  *B41F 16/00* (2006.01)
  *H01L 33/00* (2010.01)

(52) U.S. Cl.
  CPC ...... *H01L 33/0093* (2020.05); *H01L 33/0095* (2013.01); *H01L 33/54* (2013.01); *H01L 33/60* (2013.01); *H01L 2933/005* (2013.01); *H01L 2933/0066* (2013.01)

(56) References Cited

U.S. PATENT DOCUMENTS

| | | |
|---|---|---|
| 7,195,733 B2 | 3/2007 | Rogers et al. |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,333,860 B1 | 12/2012 | Bibi et al. |
| 8,470,701 B2 | 6/2013 | Rogers et al. |
| 8,558,243 B2 | 10/2013 | Bibi et al. |
| 8,722,458 B2 | 5/2014 | Rogers et al. |
| 8,791,474 B1 | 7/2014 | Bibi et al. |
| 8,794,501 B2 | 8/2014 | Bibi et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibi et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibi et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibi et al. |
| 9,252,375 B2 | 2/2016 | Bibi et al. |
| 9,355,854 B2 | 5/2016 | Meitl et al. |
| 9,358,775 B2 | 6/2016 | Bower et al. |
| 9,367,094 B2 | 6/2016 | Bibi et al. |
| 9,412,727 B2 | 8/2016 | Menard et al. |
| 9,478,583 B2 | 10/2016 | Hu et al. |
| 9,484,504 B2 | 11/2016 | Bibi et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibi et al. |
| 9,929,053 B2 | 3/2018 | Bower et al. |
| 10,153,256 B2 | 12/2018 | Cok et al. |
| 10,153,257 B2 | 12/2018 | Cok et al. |
| 11,094,870 B2 | 8/2021 | Bower et al. |
| 11,569,425 B2 | 1/2023 | Bower et al. |
| 2003/0141570 A1 | 7/2003 | Chen et al. |
| 2010/0306993 A1 | 12/2010 | Mayyas et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2016/0093600 A1 | 3/2016 | Bower et al. |
| 2017/0244386 A1 | 8/2017 | Bower et al. |
| 2017/0256521 A1* | 9/2017 | Cok ............... H01L 25/162 |
| 2017/0287789 A1* | 10/2017 | Bower ............. H01L 24/92 |
| 2017/0338374 A1 | 11/2017 | Zou et al. |
| 2018/0174932 A1 | 6/2018 | Cok et al. |
| 2018/0208378 A1* | 7/2018 | Fu ................. B65D 85/672 |
| 2020/0043400 A1* | 2/2020 | Chen ............... H01L 33/08 |
| 2021/0288235 A1 | 9/2021 | Bower et al. |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335--341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

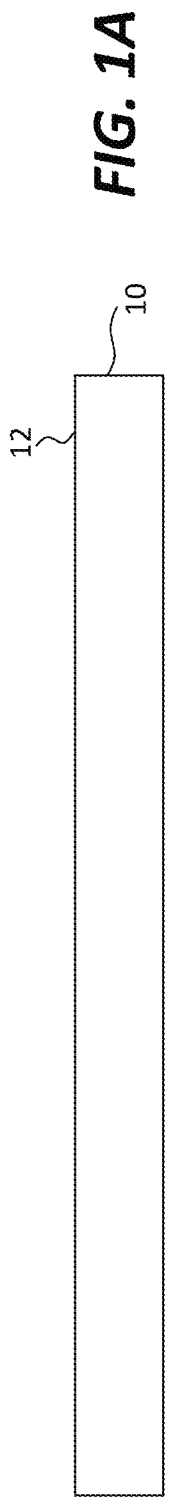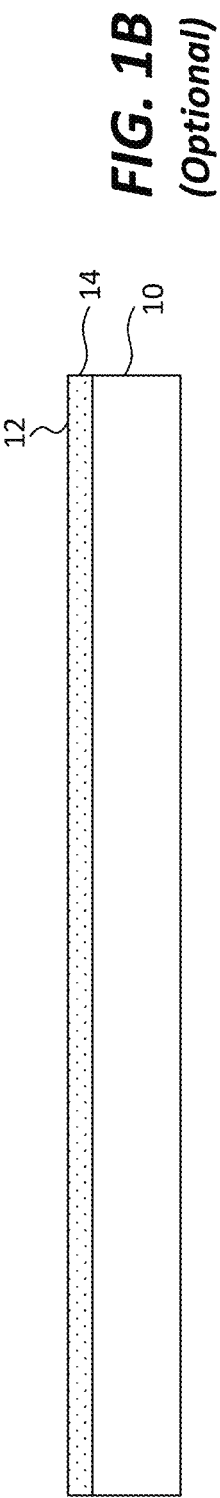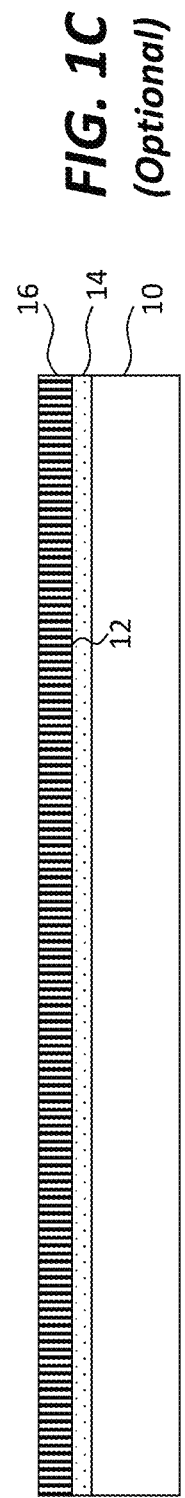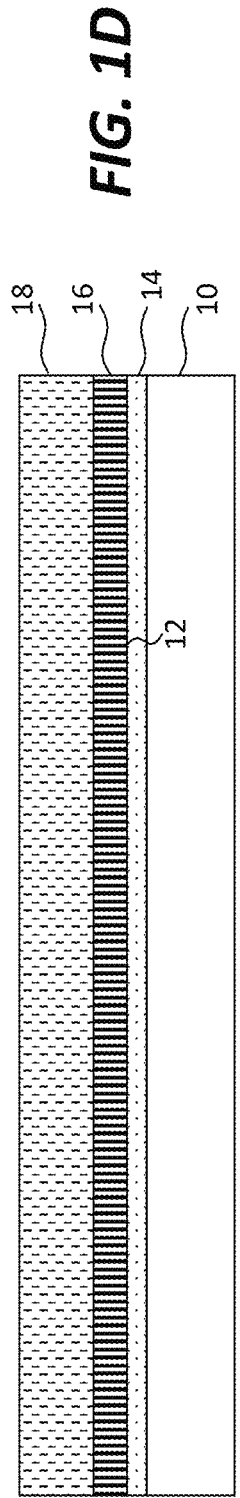

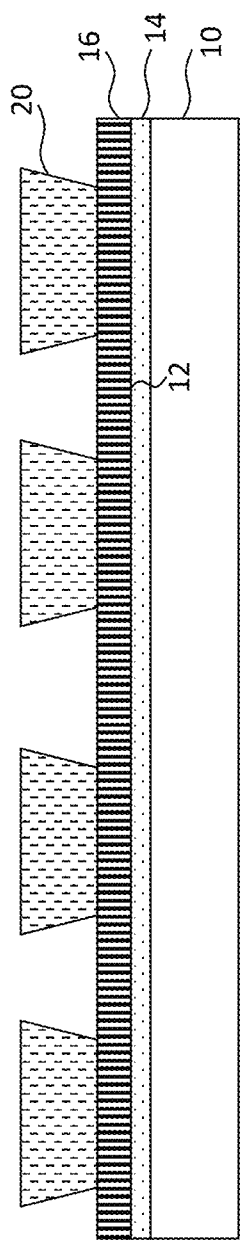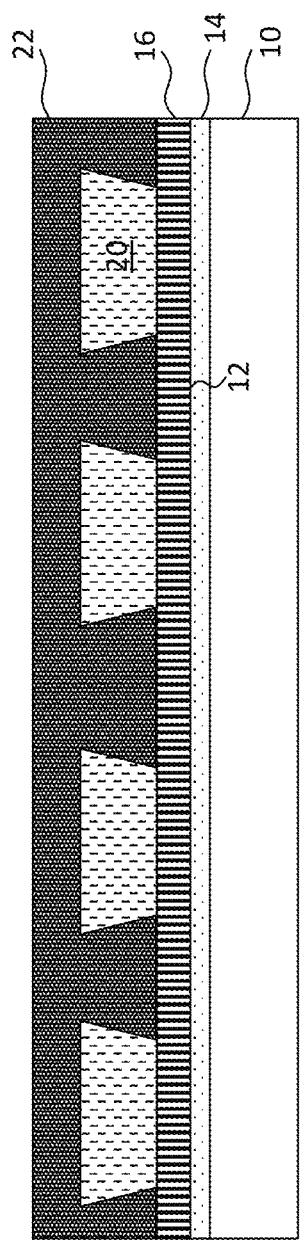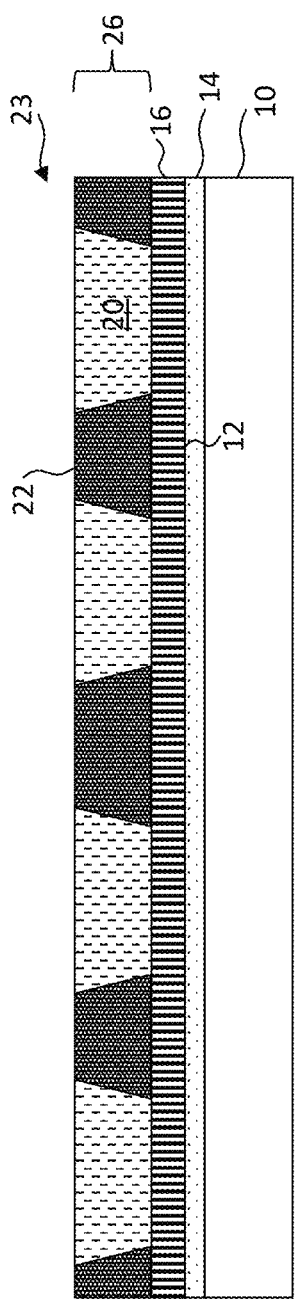

(Optional)

(Optional)

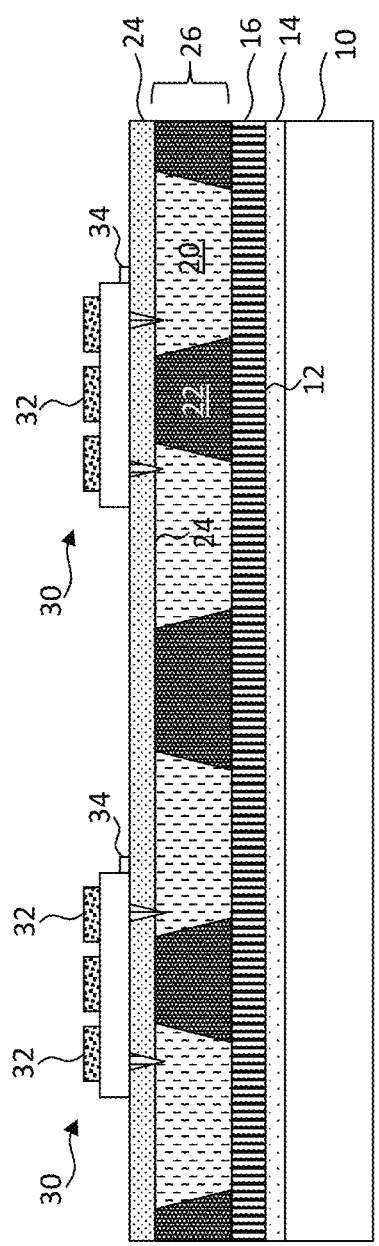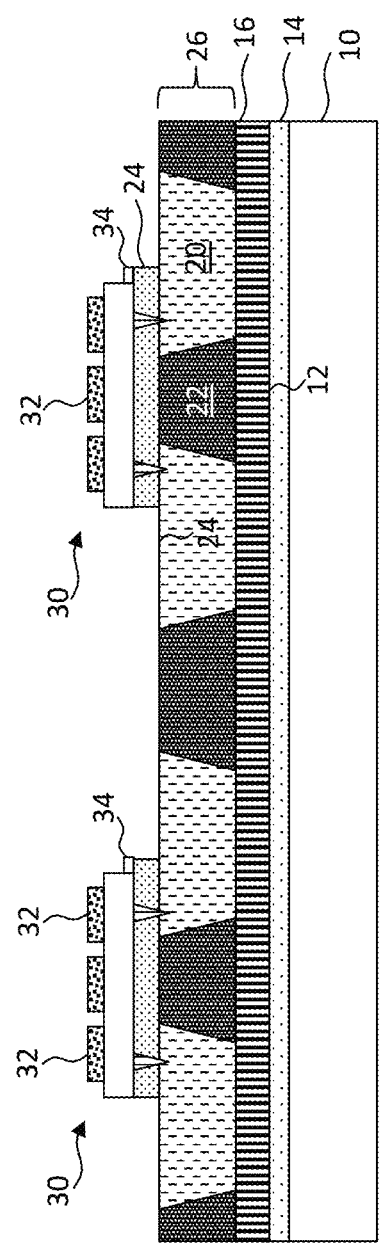

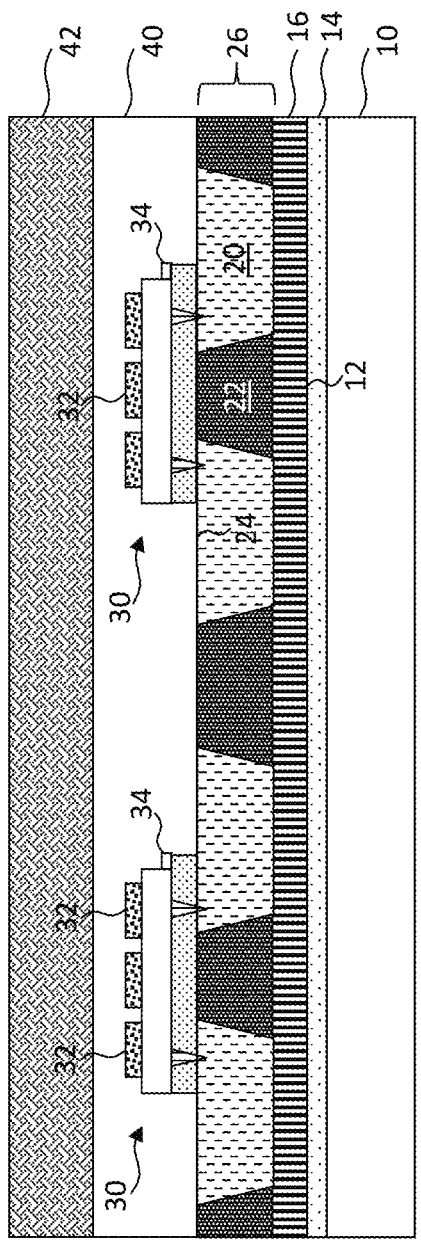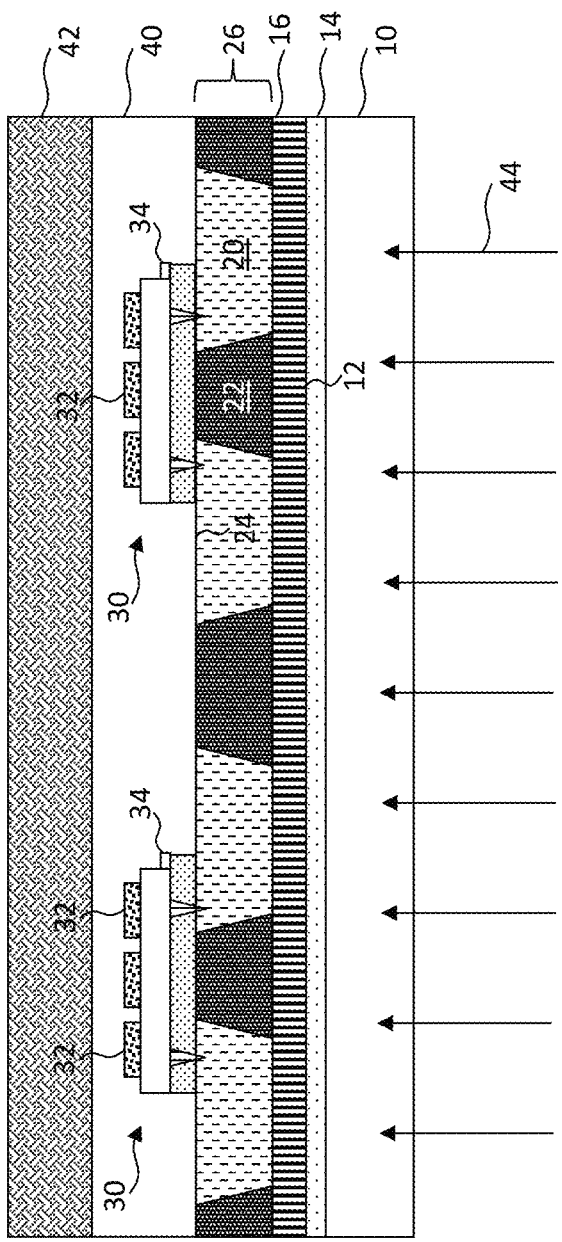

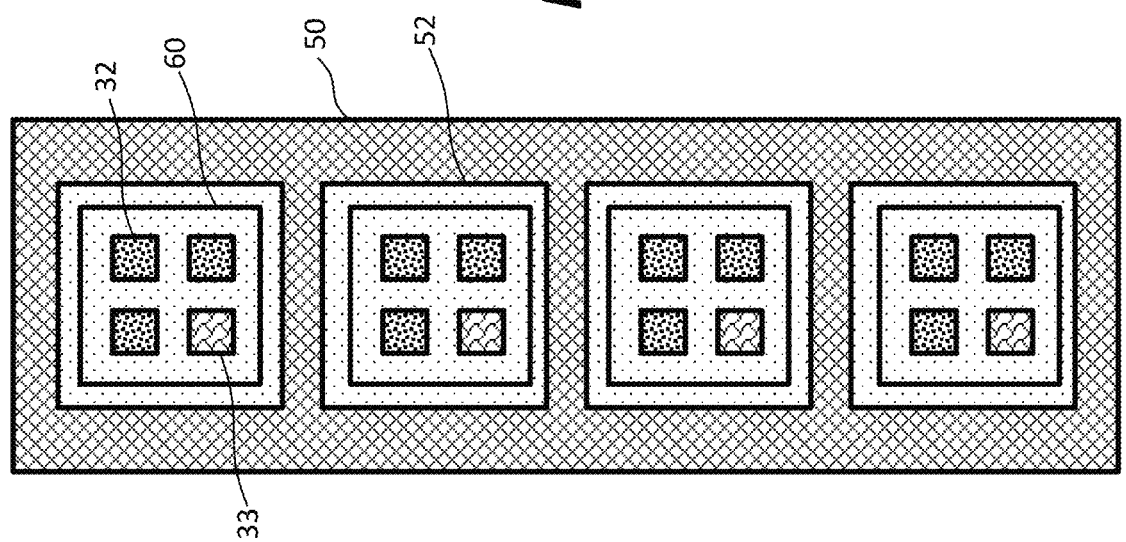

SURFACE-MOUNTABLE PIXEL PACKAGES AND PIXEL ENGINES

PRIORITY APPLICATIONS

This application is a continuation of U.S. patent application Ser. No. 16/810,775, filed Mar. 5, 2020, entitled Surface-Mountable Pixel Packages and Pixel Engines, which claims the benefit of U.S. Provisional Patent Application No. 62/817,491, filed on Mar. 12, 2019, entitled Surface-Mountable Pixel Packages and Pixel Engines, the content of each of which is hereby incorporated by reference herein in its entirety.

TECHNICAL FIELD

The present disclosure relates generally to surface-mountable packaged pixel engine modules for displays.

BACKGROUND

Displays comprise arrays of pixels having sub-pixels that each emit light of one or more colors. In active-matrix displays, a pixel circuit local to each pixel controls the one or more light emitters of the pixel. In passive-matrix displays, the sub-pixel light emitters of each pixel are directly controlled externally to the array of pixels, for example by row and column drivers.

Displays can comprise liquid crystals, organic light emitters, or inorganic light emitters, among other technologies. Liquid crystals and organic light emitters are usually formed on or over a display substrate and inorganic light emitters are usually constructed on a native substrate and assembled together on a non-native display substrate, at least for displays that are larger than micro-displays.

In order to achieve a desirably high resolution for larger-format inorganic light-emitting diode displays, it is necessary to assemble the light emitting diodes (LEDs) on a display substrate. Inorganic light-emitting diode displays using micro-LEDs (for example having an area less than 100 microns square or having an area small enough that it is not visible to an unaided observer of the display at a designed viewing distance) can be constructed, for example, as described in U.S. Pat. No. 8,722,458 entitled Optical Systems Fabricated by Printing-Based Assembly teaches transferring light-emitting, light-sensing, or light-collecting semiconductor elements from a wafer substrate to a destination substrate. U.S. Pat. No. 5,739,800 describes an LED display chip with an array of micro-LEDs mounted on a mounting substrate and electrically connected to a driver substrate. U.S. Pat. Nos. 10,153,256 and 10,153,257 describe micro-transfer printable electronic components useful in inorganic LED displays. U.S. patent application Ser. No. 14/822,868 discloses assembly methods using pixel modules comprising intermediate substrates and groups of light emitters.

Surface-mount technology (SMT) is a widely used and relatively inexpensive assembly method for directly locating packaged electronic devices on a printed circuit board or other substrate, such as a display substrate, and interconnected on the surface of the substrate, rather than inserting package pins into holes on the substrate. This technique reduces substrate costs, but the smallest size of the packaged electronic devices is limited, for example to 200 microns, 500 microns, or larger. Surface-mount technology can increase production throughput and reduce costs but is consequently limited in its capacity for high-resolution systems, such as display systems.

However, there remains a need for structures, methods, and materials for efficiently integrating arrays of pixels on a display substrate at low cost to achieve high-resolution displays.

SUMMARY

In some embodiments of the present disclosure, a method of making a (e.g., surface-mountable) pixel engine package comprises providing an array of spaced-apart conductive pillars and an insulating mold compound laterally disposed between the conductive pillars on a substrate, together defining a planarized surface. Pixel engines comprising connection posts are printed to the conductive pillars on the planarized surface so that each of the connection posts is in electrical contact with one of the conductive pillars. The pixel engines are tested to determine known-good pixel engines. An optically clear mold compound is provided over the planarized surface and tested pixel engines, a tape is adhered to the optically clear mold compound, and the substrate is removed. The optically clear mold compound, the insulating mold compound, the conductive pillars, the optically clear mold compound, and the tested pixel engines are singulated to provide pixel packages that comprise the pixel engines and the known-good pixel engines are transferred to a reel or tray.

In some embodiments, the method comprises assembling the pixel packages that comprise the known-good pixel engines onto wiring boards. The pixel packages can be assembled using surface-mount-technology (SMT).

In some embodiments, the method comprises disposing a wiring layer in electrical contact with the conductive pillars. The wiring layer can be disposed on the planarized surface or on and in contact with the substrate.

In some embodiments, the method comprises disposing insulating mold compound over the planarized surface between the pixel engines after the pixel engines are transfer printed. The transfer can be a laser transfer or a micro-transfer print using a stamp. The removal can be a laser release by heating an optional release layer disposed between the substrate and the pixel package.

In some embodiments, the method comprises comprise disposing an adhesive layer over the planarized surface prior to transfer printing the pixel engines and patterning the adhesive layer to expose a portion of each of the conductive pillars. The pixel engines can be tested through electrical connections made through the portion of each of the conductive pillars that is exposed.

In some embodiments, the method comprises forming the planarized surface, for example by grinding, back-grinding, etching, or polishing.

In some embodiments of the present disclosure, a surface-mountable pixel engine package comprises a substrate having a substrate surface, an array of spaced-apart conductive pillars disposed on or over the substrate surface, an insulating mold compound laterally disposed over the substrate surface between the conductive pillars such that the conductive pillars and the insulating mold compound together define a planarized surface, a pixel engine comprising connection posts disposed on the planarized surface with each of the connection posts in electrical contact with one of the conductive pillars, and an optically clear mold compound disposed over the planarized surface and pixel engine.

The pixel engine can comprise a pixel-engine substrate and the pixel-engine substrate can comprise a broken or separated tether.

In some embodiments of the present disclosure, the surface-mountable pixel engine package comprises a tape adhered to the optically clear mold compound on a side of the optically clear mold compound opposite the pixel engine.

In some embodiments of the present disclosure, the substrate comprises a release layer that forms the substrate surface.

In some embodiments of the present disclosure, the conductive layer and conductive pillars each comprise at least 50% (e.g., at least 50 weight percent) copper. The conductive pillars can comprise a gold layer 21 that forms a portion of the planarized surface.

In some embodiments of the present disclosure, the surface-mountable pixel engine package comprises a wiring layer disposed in electrical contact with the conductive pillars and in electrical contact with the pixel engine. In some embodiments, the wiring layer is disposed on the planarized surface between the pixel engine and the substrate surface. In some embodiments, the wiring layer is disposed on and in contact with the substrate surface. In some embodiments, the wiring layer comprises substantially black ITO. The substantially black ITO can comprise layers of ITO interspersed by one or more layers of chromium or a reflective layer disposed between the substantially black ITO and the substrate surface, or both.

In some embodiments of the present disclosure, the connection posts are laterally separated by a distance less than a lateral separation of the conductive pillars over the substrate surface.

In some embodiments of the present disclosure, the insulating mold compound is substantially black, and can comprise any one or more of carbon black, dyes, and pigments.

In some embodiments of the present disclosure, the surface-mountable pixel engine package comprises insulating mold compound laterally disposed in a common layer with the pixel engines.

In some embodiments of the present disclosure, the pixel engines comprise a pixel controller. In some embodiments of the present disclosure, the pixel engines comprise two or more light emitters that emit different colors of light. The light emitters can be inorganic micro-light-emitting diodes (LEDs) comprising inorganic LEDs having at least one of a length and a width that is not greater than 200 microns (e.g., not greater than 100 microns, not greater than 50 microns, not greater than 25 microns, not greater than 10 microns, not greater than 5 microns, or not greater than 2 microns).

In some embodiments of the present disclosure, the one or more light emitters each comprise a broken or separated tether.

According to some embodiments of the present disclosure, a display surface-mountable pixel engine package comprises a display substrate and one or more surface-mounted pixel packages disposed on the display substrate. Each of the pixel packages comprises an array of spaced-apart conductive pillars and an insulating mold compound laterally disposed between the conductive pillars defining a planarized surface. A pixel engine comprising connection posts is in electrical contact with the conductive pillars disposed on the planarized surface. Individually singulated optically clear mold compound is disposed over the pixel engine and the planarized surface.

According to some embodiments of the present disclosure, a reel comprises a reel substrate comprising a plurality of pockets and a surface-mountable pixel package is disposed in each of the pockets. The pixel package comprises spaced-apart conductive pillars and an insulating mold compound laterally disposed over the substrate surface between the conductive pillars defining a planarized surface. A pixel engine comprising connection posts is in electrical contact with the conductive pillars disposed on the planarized surface. Individually singulated optically clear mold compound is disposed over the pixel engine and the planarized surface.

The present disclosure provides, inter alia, a display having reduced manufacturing cost and improved resolution.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1H:
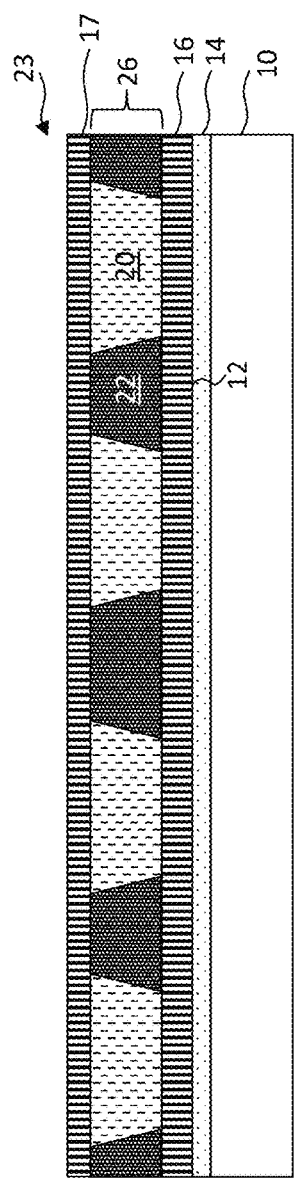
FIGS. 1A-1S are successive cross sections illustrating methods and structures according to illustrative embodiments of the present disclosure.
FIG. 1T is a top view corresponding to FIG. 1S according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

According to embodiments of the present disclosure, a low-cost wafer-level pixel package for displays is provided and tested before assembly onto a final display substrate or other wired substrate.

Figure 1I:
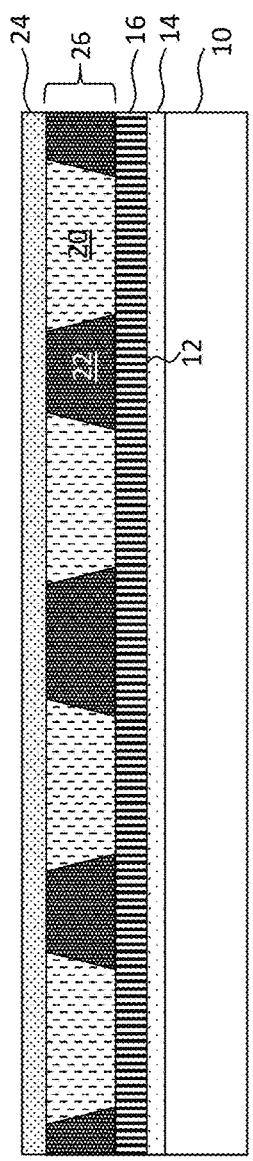
Figure 1J:
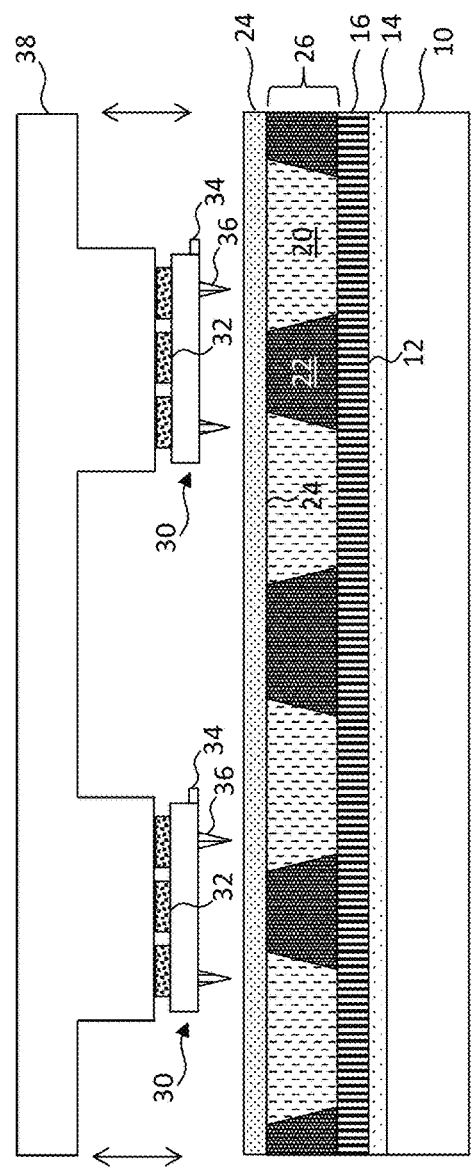
Figure 1M:
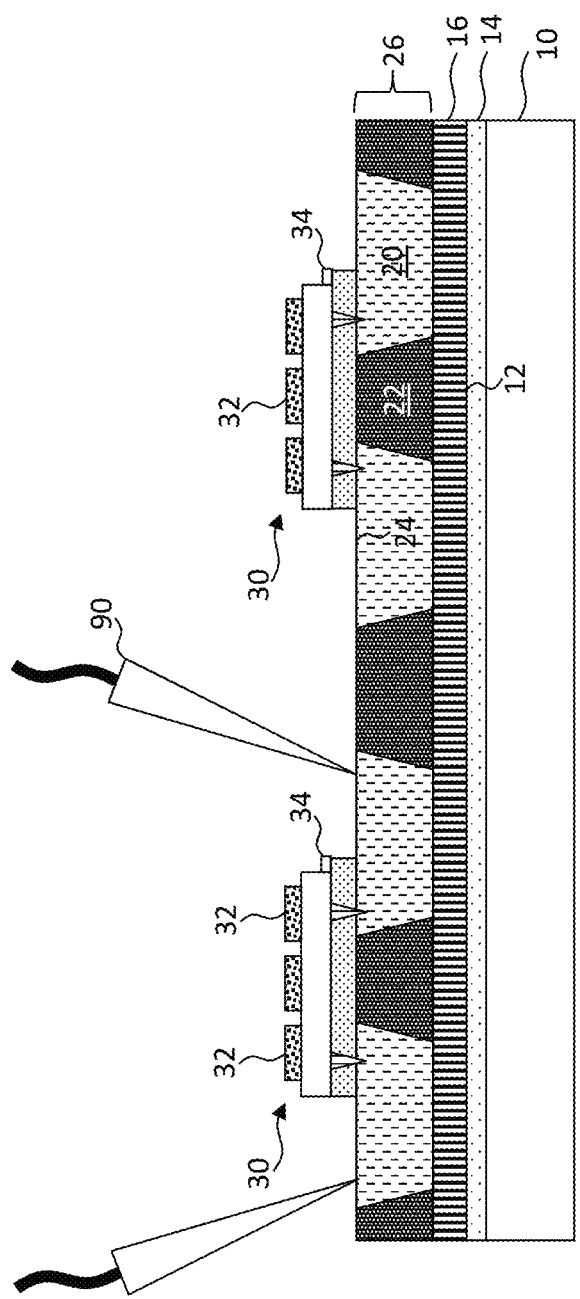
Figure 1N:
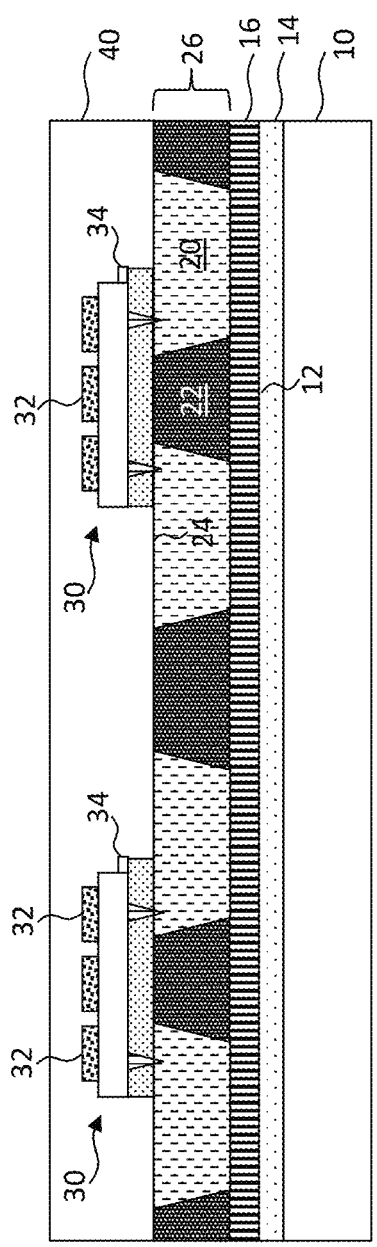
Figure 1Q:
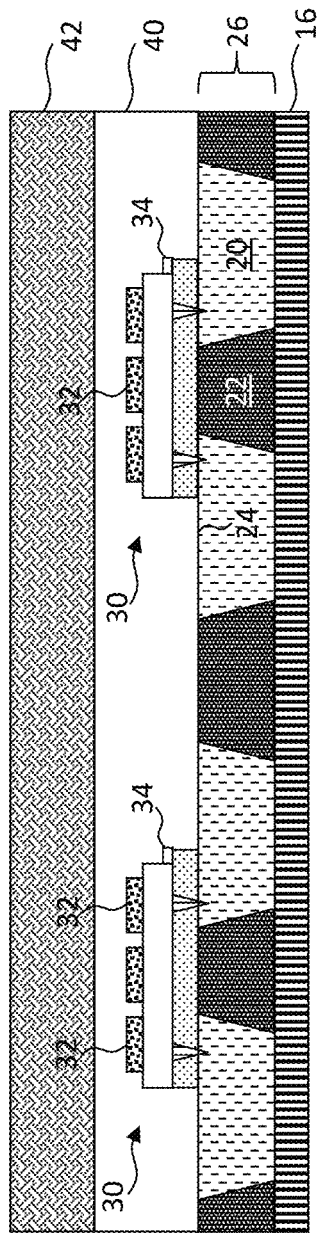
Figure 1R:
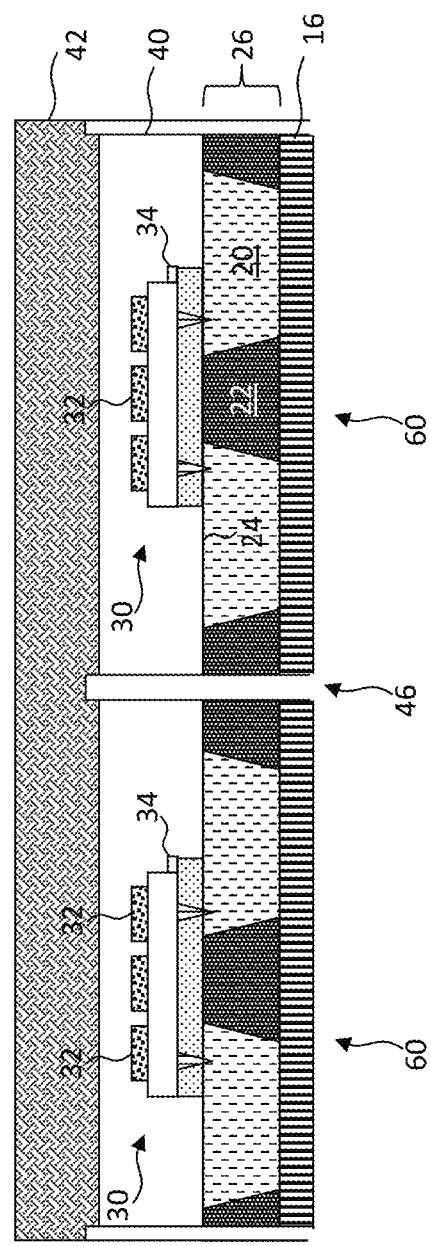
Figure 1S:
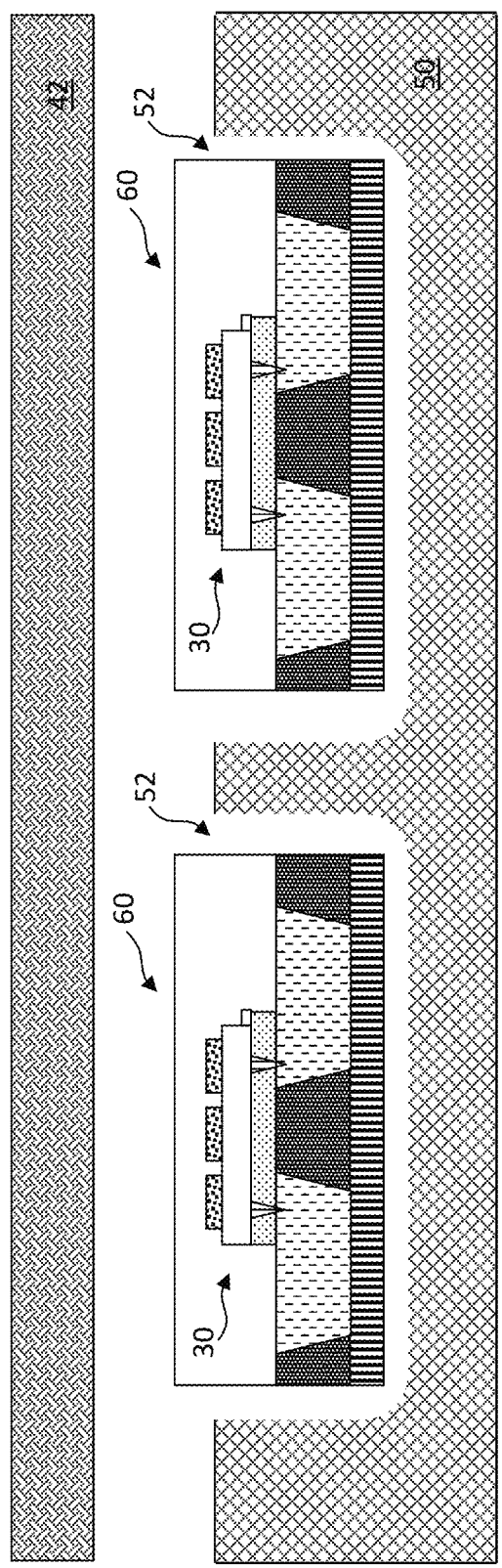
Figure 2:
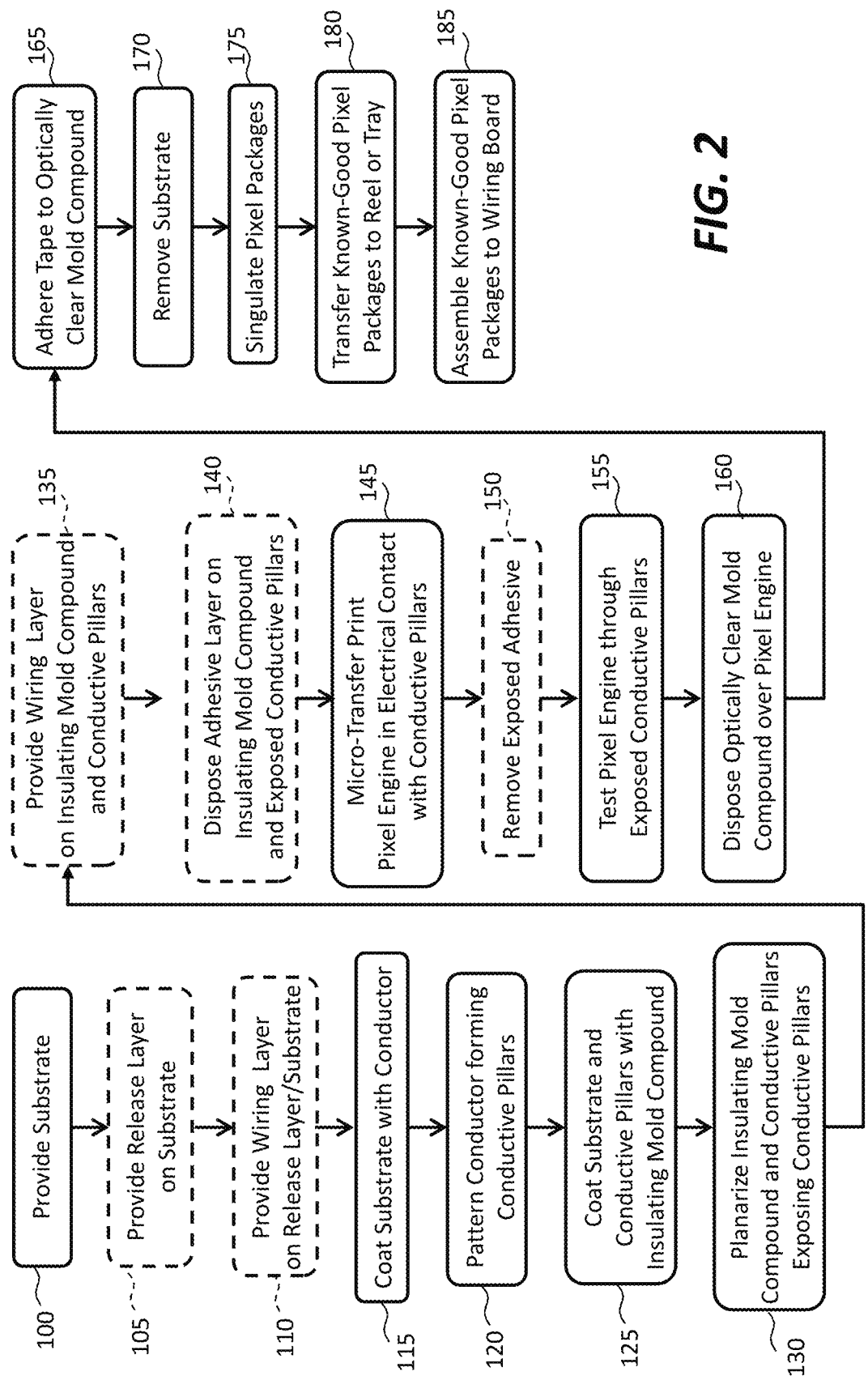
FIG. 2 is a flow diagram illustrating methods according to embodiments of the present disclosure.

Referring to the successive illustrations of FIGS. 1A-1SB and the flow diagram of FIG. 2, a method according to some embodiments of the present disclosure comprises providing a substrate 10 with a substrate surface 12 in step 100, as shown in FIG. 1A. A suitable substrate 10 can comprise, for example, glass, plastic, sapphire, or quartz. Referring to FIG. 1B, in step 105 an optional release layer 14 is disposed on the original substrate 10. Optional release layer 14 can be, for example, a light-absorbing ablative layer that absorbs laser light to detach layers disposed on optional release layer 14 from substrate 10, for example as with laser liftoff. In such examples, original substrate 10 is at least partially transparent to laser light (electromagnetic radiation) emitted by a laser. If present, the optional release layer 14 is said to be a portion of substrate 10 and substrate surface 12 is then the exposed surface of optional release layer 14. Moreover, when reference is made to substrate 10 herein, an optional release layer 14 can be included (even when not expressly referenced).

In optional step 110, and as shown in FIG. 1C, an optional substrate wiring layer 16 is disposed on substrate surface 12 of substrate 10 (e.g., the exposed surface of optional release layer 14 if present), for example using photolithographic methods and materials found in the display and integrated circuit industries. Substrate wiring layer 16 can be an assortment of patterned electrically conductive wires forming a passive circuit that can electrically interconnect other devices. Substrate wiring layer 16 can, for example, comprise metal wires, or printed circuit board traces made using conventional photolithographic methods and materials and can be embedded in a resin matrix. Substrate wiring layer 16 can include patterned electrically conductive wires arranged in one or more levels within the layer, dielectric material, and, optionally, vias between different levels of patterned electrically conductive wires separated by levels of dielectric material.

Referring to FIG. 1D, in step 115 substrate surface 12 is coated with a conductive layer 18, for example a metal evaporated onto substrate surface 12, and patterned in step 120 to form conductive pillars 20 (e.g., as shown in FIG. 1E) that can be, for example, several microns thick. In methods according to some embodiments, a conductive foil (for example a copper foil that is at least 50% (e.g., at least 50 weight percent) copper) is applied (for example adhered) to substrate surface 12 in step 115 and patterned to form conductive pillars 20 in step 120. Conductive pillars 20 can have a reentrant profile (e.g., as shown in FIG. 1D), a vertical profile, or a sloped profile with a top area smaller than a bottom area adjacent to substrate surface 12. Conductive pillars 20 are electrically conductive and, if substrate wiring layer 16 is present, can be electrically connected to substrate wiring layer 16. Conductive pillars 20 can be or comprise copper, silver, gold, aluminum, titanium, tungsten, tin, or any other suitable conductive material.

Referring to FIG. 1F, in step 125, substrate surface 12 and conductive pillars 20 are coated with an insulating mold compound 22, for example a resin or a polymer. Insulating mold compound 22 can be curable, for example with heat or light. In some embodiments, insulating mold compound 22 is light absorbing, for example appears black (e.g., to a human observer), and absorbs visible light. In step 130 and as shown in FIG. 1G, a planarized surface 23 is formed that exposes a surface of conductive pillars 20 defining patterned conductive layer 26. Planarized surface 23 can be substantially planar within the limitations of a manufacturing process and can be formed, for example, by etching, polishing, or grinding.

Optionally, in step 135 and as illustrated in FIG. 1H, an optional package wiring layer 17 can be disposed or otherwise formed on the planarized surface 23. Optional package wiring layer 17 is electrically connected to conductive pillars 20 and, optionally if substrate wiring layer 16 is present, to substrate wiring layer 16 and can be embedded in a resin matrix. Optional package wiring layer 17 can provide electrical interconnections, as does optional substrate wiring layer 16 and can be formed using similar printed-circuit board or photolithographic methods found in the display or integrated circuit industries. For clarity, optional package wiring layer 17 is omitted from FIGS. 1I to 1SB but can be present in some embodiments of the present disclosure. Package wiring layer 17 can include patterned electrically conductive wires arranged in one or more levels within the layer, dielectric material, and, optionally, vias between different levels of patterned electrically conductive wires separated by levels of dielectric material.

Figure 3:
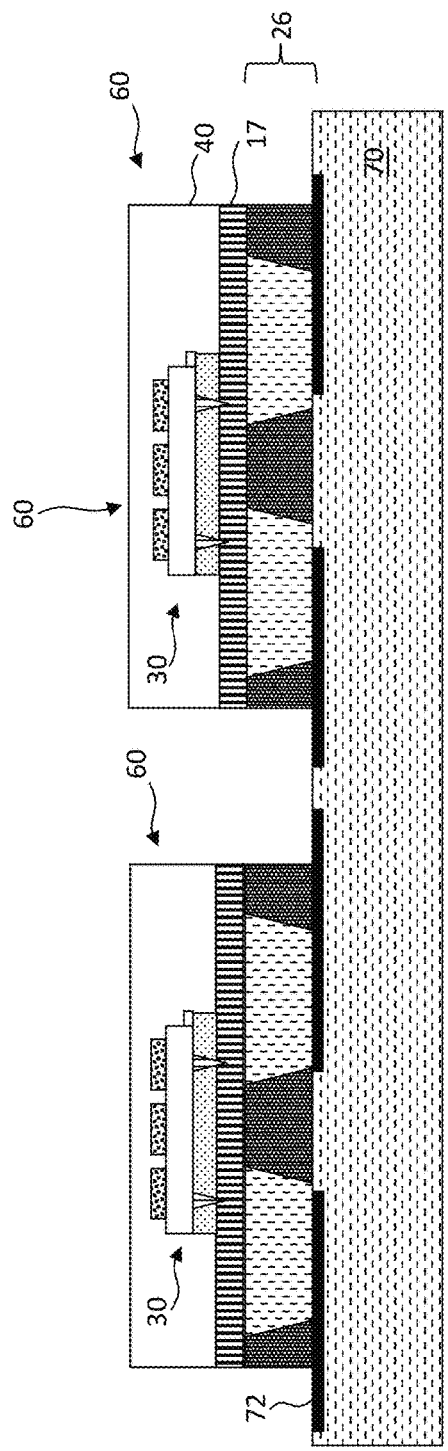
FIGS. 3-5 are cross sections of pixel packages and a display substrate according to some illustrative embodiments of the present disclosure.

Referring to FIG. 1I, in step 140 an optional adhesive layer 24 is optionally disposed over planarized surface 23. If optional package wiring layer 17 is present, optional adhesive layer 24 is disposed over optional package wiring layer 17 (e.g., as shown in FIG. 3 and discussed below). Optional adhesive layer 24 can be, for example a few microns thick (e.g., no more than 20 microns thick). Optional adhesive layer 24 can be disposed by coating or spraying. In step 145 and as shown in FIG. 1J, a pixel engine 30 is transfer printed, for example micro-transfer printed using a stamp 38, onto planarized surface 23 or optional adhesive layer 24. Pixel engine 30 can comprise one or more integrated circuits, one or more light-emitting elements such as inorganic light-emitting diodes, and circuitry formed on a pixel engine 30 substrate using photolithographic methods and materials that electrically or optically interconnects components disposed on the pixel engine 30 substrate. Pixel engine 30 can be or comprise a pixel in an active-matrix or passive-matrix display and can emit light, for example colored or white light, under the control of a display controller, for example comprising row and column controllers. A variety of transfer printing tools, methods, or devices can be used. In some embodiments, a native source pixel engine wafer is micro-transfer printed to planarized surface 23 or adhesive layer 24 and can comprise a broken (e.g., fractured) or separated tether 34 resulting from the transfer.

Pixel engine 30 can comprise electrically conductive connection posts 36, for example sharp spikes, that extend from a pixel engine 30 substrate to form an electrical connection between components of pixel engine 30 and conductive pillars 20, either through direct contact or, optionally, through optional package wiring layer 17 (e.g., as shown in FIG. 1K). Connection posts 36 can extend through optional adhesive layer 24 and make an electrical contact as a consequence of transfer printing. Pixel engine 30 can have at least one of a length and a width that is no greater than 200 microns (e.g., no greater than 200 microns, no greater than 50 microns, no greater than 25 microns, no greater than 10 microns, no greater than 5 microns, or no greater than 2 microns). In some embodiments of the present disclosure, pixel engine 30 is itself too small to be surface mounted using known surface-mounting technology. Instead, pixel engine 30 can be micro-transfer printed using a visco-elastic stamp 38 to form a pixel package 60. Pixel package 60 may be large enough to transfer using surface mount technology (SMT) or similar. In some embodiments, pixel package 60 has a size in at least one dimension (e.g., at least two dimensions) is at least 100 microns (e.g., at least 200 microns, at least 300 microns, or at least 500 microns). Components of pixel engine 30 can have a size smaller than pixel engine 30, for example micro-LEDs having at least one of a width and a length no greater than 100 microns, (e.g., no greater than 50 microns, no greater than 25 microns, no greater than 10 microns, no greater than 5 microns, or no greater than 2 microns) disposed on or over a pixel. Similarly, any pixel controller that is a part of pixel engine 30 can have at least one of a width and a length no greater than 50 microns (e.g., no greater than 25 microns, or no greater than 15 microns). Accordingly, in some embodiments, components of pixel engine 30 can also be assembled into pixel engine 30 using micro-transfer printing and can each comprise tethers 34.

Figure 9:
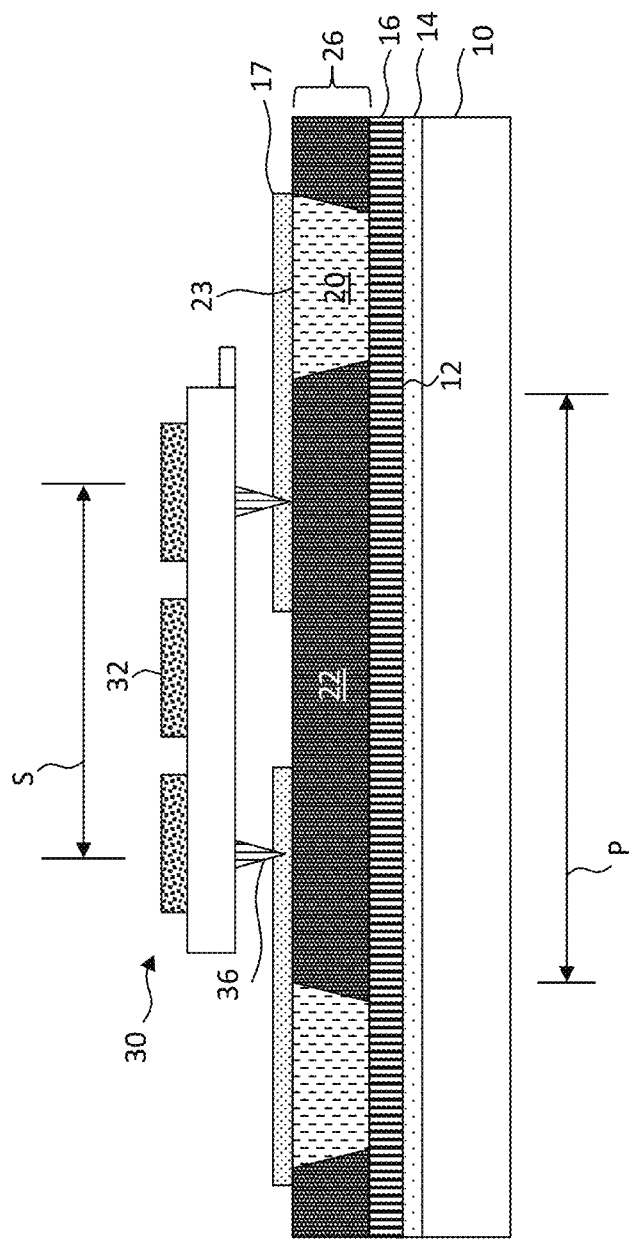
FIG. 9 is a cross section of a portion of a pixel package according to some illustrative embodiments of the present disclosure.

The lateral separation between connection posts 36 can be equal to or greater than the lateral separation between conductive pillars 20 (e.g., as shown in FIG. 1K). In some embodiments, connection posts 36 are laterally separated by a distance D less than the lateral separation of the conductive pillars 20 over the substrate surface 12. As shown in FIG. 9, the lateral separation of the conductive pillars 20 is P and the lateral separation of the connection posts 36 is S, so that D is a positive value equal to (P–S). As a non-limiting example, connection posts 36 can be laterally separated by a distance that is no more than 200 microns (e.g., no more than 100 microns) and conductive pillars can be laterally separated by a distance that is no less than 250 microns (e.g., no less than 300 microns or no less than 500 microns). Electrical connection between connection posts 36 and conductive pillars 20 can be made by optional package wiring layer 17, for example as shown in FIG. 9. In some embodiments, for example, electric connection between connection posts 36 and conductive pillars 20 can be made through an exposed, electrically conductive trace disposed on planarized surface 23. In some embodiments, pixel package 60 includes a relatively small pixel engine 30, for example one that has at least one dimension (e.g., a length and/or a width) that is smaller than a separation distance between conductive pillars 20. Such a pixel package 60 can include a conductive layer (e.g., black ITO in wiring layer 17) that provides electrical connections between the conductive pillars and the pixel engine. By providing a more widely separated electrical connection with conductive pillars 20, pixel engine 30, together with conductive pillars 20 and insulating mold material 22, provide a larger module (e.g., pixel package 60) that can be surface mounted at relatively low cost using readily available assembly equipment found in the integrated circuit and printed circuit board industries and while maintaining, at least partially, advantages of using unpackaged inorganic micro-LED light emitters and pixel controllers useful for micro-transfer printing.

If adhesive layer 24 is provided, it can be optionally patternwise removed from around pixel engines 30 but not beneath pixel engines 30, for example using an etchant or directed plasma, in optional step 150 and as shown in FIG. 1L.

As shown in FIGS. 1M and 1n step 155, pixel engines 30 are tested, for example using probes 90 electrically connected to electrical or optoelectrical test equipment (not shown in the Figures). The electrical or optoelectrical test equipment provides power and signals to conductive pillars 20, causing pixel engine 30 to operate. The operation and a functional determination are recorded by the optoelectrical test system and a reference to known-good pixel engines 30 generated and used in subsequent steps. Note that, although the Figures illustrate only two connection posts 36 and conductive pillars 20 for each pixel engine 30 and pixel package 60, in practice many more than two can be provided, for example, four, five, eight, or more. Connection posts 36 and conductive pillars 20 can be arranged in a row (a one-dimensional line) or in a two-dimensional configuration, for example a two by three array of six electrical connections occupying an area over planarized surface 23 and in patterned conductive layer 26.

Once the testing is complete, in step 160 and as illustrated in FIG. 1N, an optically clear mold compound 40 is disposed over planarized surface 23, any optional adhesive layer 24, or any optional package wiring layer 27. Optically clear mold compound 40 can be an optically clear adhesive, for example as is commercially available, for example from various optical component suppliers. Optically clear adhesives are typically used to bond optical elements together in an optical system. Optically clear mold compound 40 can have a transparency no less than 50% (e.g., no less than 75%, no less than 85%, no less than 90%, no less than 95, or no less than 98%) to visible light or to light emitted by light emitters 32 of pixel engine 30. Optically clear mold compound 40 can be disposed, for example by coating, spraying, or inkjet depositing a liquid layer over the planarized surface 23, any optional adhesive layer 24, or optional package wiring layer 27.

Once the optically clear mold compound 40 is applied, a tape 42 is applied in step 165 to the optically clear mold compound 40 and optically clear mold compound 40 is cured so that tape 42 is adhered to optically clear mold compound 40, pixel engine 30, and patterned conductive layer 26, as shown in FIG. 1O. Tape 42 can be blue tape. In some embodiments, optically clear mold compound 40 is applied to tape 42 and adhered to pixel engine 30 and patterned conductive layer 26.

In step 170 substrate 10 is removed, for example by grinding, laser ablation, or laser liftoff. In some embodiments of the present disclosure, a laser provides radiation 44 that is absorbed by optional release layer 14, as illustrated in FIG. 1P. Material in optional release layer 14 is heated and converted to a gas that releases substrate 10 from patterned conductive layer 26 or optional substrate wiring layer 16 (e.g., as shown in FIG. 1Q).

Referring to FIG. 1R, in step 175, pixel packages 60 are defined by singulating patterned conductive layer 26, pixel engines 30, optically clear mold compound 40, and any optional substrate or optional package wiring layers 16, 17. Singulation can be done using known methods, for example dicing, cutting with a saw, scribing with a diamond tool, or laser scribing. The singulation (e.g., cut 46) can extend partially into tape 42 but does not cut through tape 42, leaving pixel packages 60 adhered to tape 42.

Referring to FIG. 1S in cross section and FIG. 1T in top view, in step 180, known-good pixel packages 60 comprising known-good pixel engines 30 (determined in test step 155, shown in FIG. 1M discussed above) are removed from tape 42 and disposed into pockets 52 of a reel 50, for use in a tape-and-reel packaging and assembly tool. In some embodiments, pixel packages 60 can be disposed into other packaging and assembly tools, such as trays. Pixel packages 60 can be surface-mountable packages that can be mounted using surface mounting technology (SMT).

Figure 4:
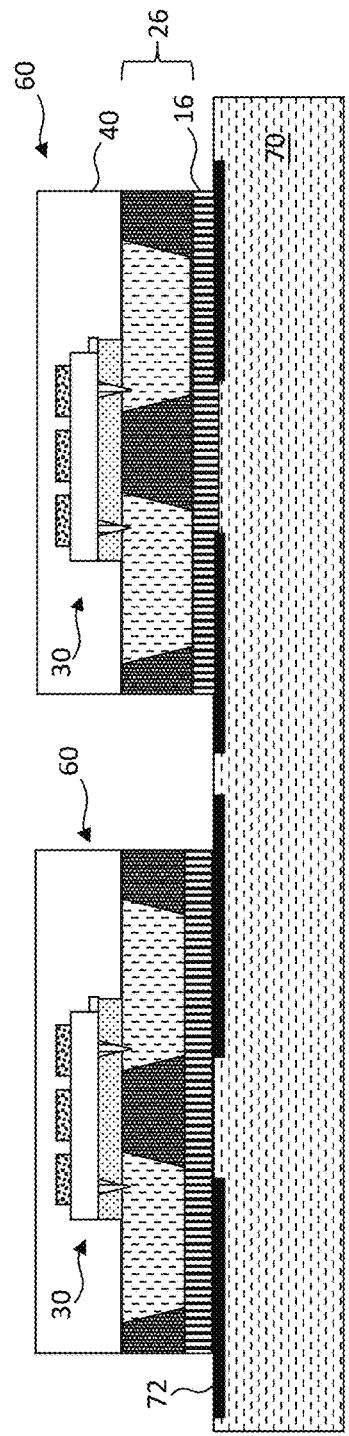
Figure 5:
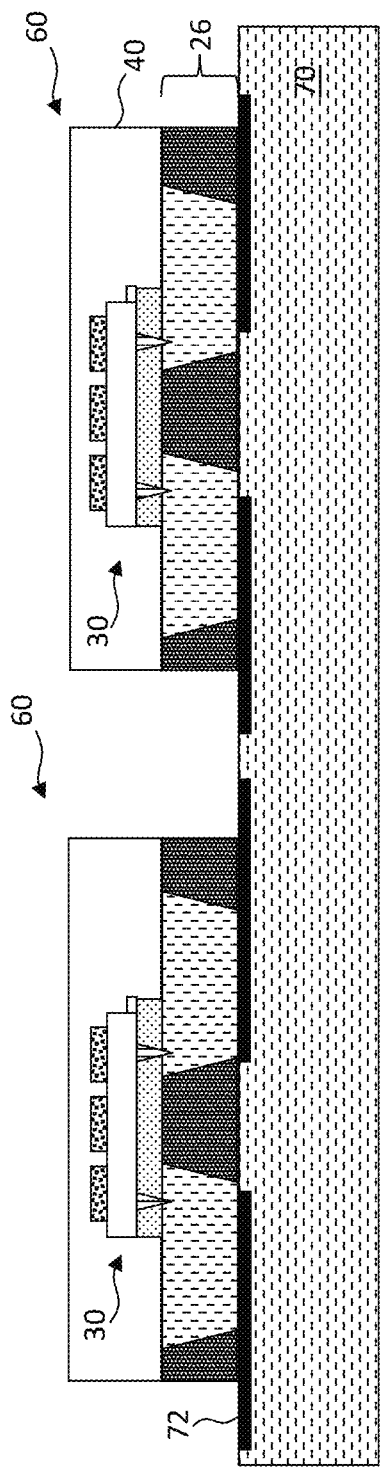

Once provided in an assembly package for assembly with an assembly tool, for example surface-mount tools, pixel packages 60 are assembled in step 185 onto a wiring board 70, for example a destination substrate such as a display substrate, as shown in the various configurations illustrated in FIGS. 3-5. Suitable wiring boards 70 can be printed printed-circuit boards or glass or polymer substrates such as are found in the display industry. FIG. 3 illustrates a wiring board 70 with pixel packages 60 each with an optional package wiring layer 17. FIG. 4 illustrates a wiring board 70 with pixel packages 60 each with a substrate wiring layer 16, and FIG. 5 illustrates a wiring board 70 with pixel packages 60 and no additional wiring layers beyond the wires 72 of the wiring board 70.

Figure 6:
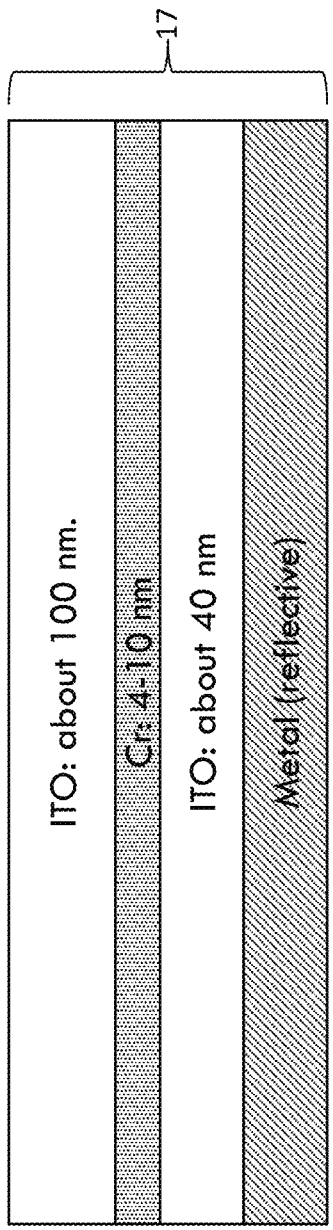
FIG. 6 is a cross section of a black conductor according to some illustrative embodiments of the present disclosure.

Referring to FIG. 6, wires of optional package wiring layer 17, substrate wiring layer 16, or wires 72 of wiring board 70 (and optionally any wires of pixel engine 30) can be black, gray, or dark wires, for example comprising layers of transparent conductor (such as transparent conductive oxides like indium tin oxide (ITO)) interspersed with a black or gray conductive material such as chromium or oxidized chromium (e.g., referred to as "black ITO"). A reflective layer can be provided beneath the stack of transparent and dark conductors, for example a reflective metal such as aluminum or silver. Incident ambient light passes through the transparent conductors, is at least partially absorbed by the dark conductor, can be reflected from the reflective metal layer, and pass again through the dark conductor, improving the contrast of the display.

Figure 7:
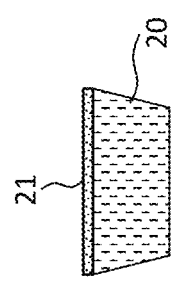
FIG. 7 is a cross section of a conductive pillar according to some illustrative embodiments of the present disclosure.

Referring to FIG. 7, conductive pillars 20 can be a material such as copper and, in some embodiments, comprise a layer or coating of another conductor, such as gold, that can facilitate electrical conduction and electrical connection to connection posts 36.

Figure 8:
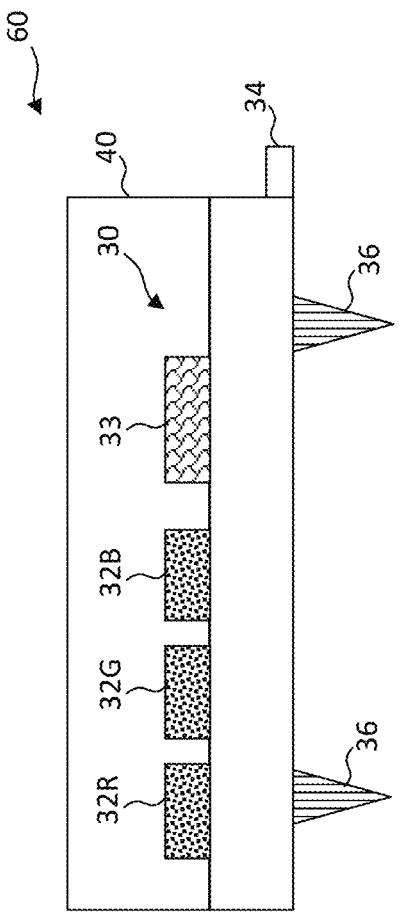
FIG. 8 is a cross section of a pixel package according to some illustrative embodiments of the present disclosure.

Referring to FIG. 8, pixel engines 30 and pixel packages 60 can comprise multiple light emitters 32R, 32G, 32B (collectively light emitters 32) that can emit different colors of light, for example red, green, or blue light respectively, and can comprise a pixel controller 33 to control the light emitters 32 in response to signals provided through connection posts 36.

Figure 10:
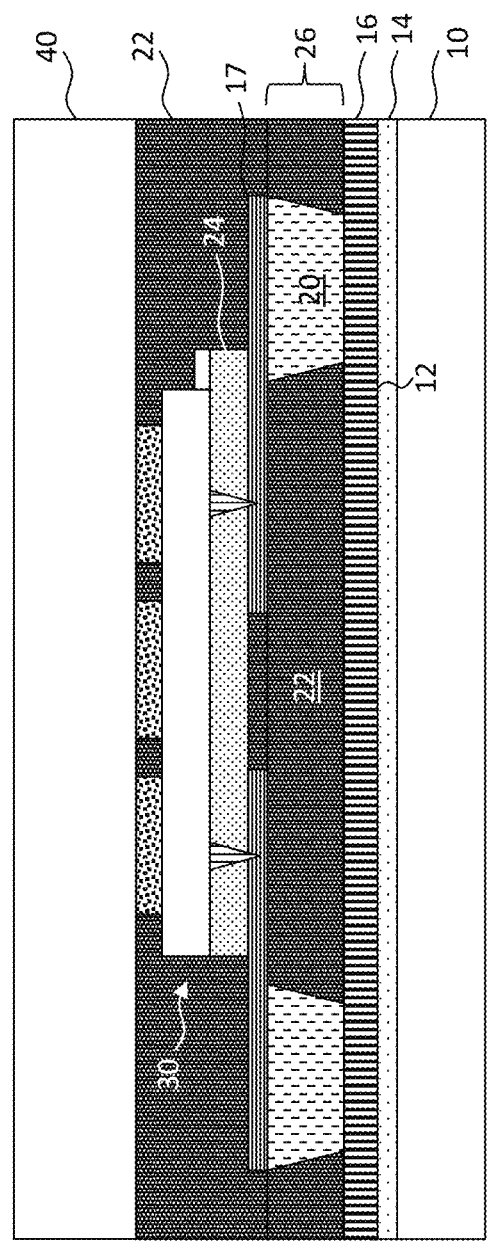
FIG. 10 is a cross section of a pixel package according to some illustrative embodiments of the present disclosure.

Referring to FIG. 10, insulating mold compound 22 can also be disposed over the planarized surface 23, any optional package wiring layer 17, and laterally between pixel engines 30 to provide additional ambient light absorption and improved contrast. The additional layer of insulating mold compound 22 can be coated, inkjet deposited, or sprayed, for example, and cured. Together with optically clear mold compound 40, it is singulated in step 175.

The assembled pixel packages 60 can be operated by a control system that provides power and control signals to wiring board 70. The power and control signals are transmitted through conductive wires or traces 72 of wiring board 70 to conductive pillars 20 in patterned conductive layer 26, and through any optional substrate or optional package wiring layers 16, 17, respectively, to connection posts 36 and to light emitters 32 or pixel controller 33 of pixel engine 30, to control pixel engine 30 to operate. Pixel engine 30 can emit light through optically clear mold compound 40 and out of the display system. Insulating mold material 22 can absorb incident ambient light to improve the contrast of the display system.

FIGS. 11-25 are additional illustrations of process steps and corresponding structures according to some embodiments, which are useful in understanding the present disclosure.

Figure 11:
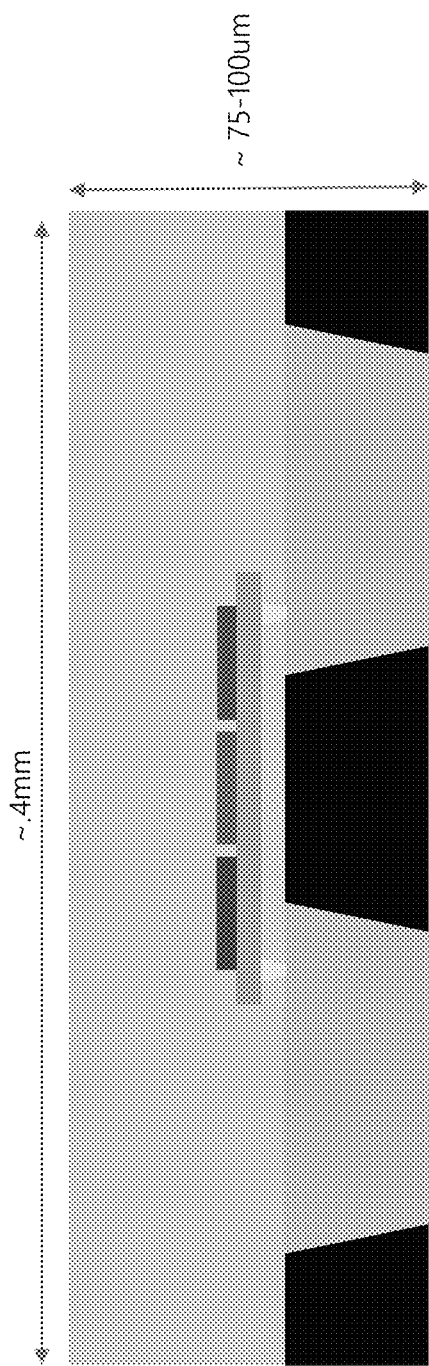
FIGS. 11-25 illustrate and describe an example method of forming a surface mountable pixel package, according to some illustrative embodiments of the present disclosure.
Figure 12:
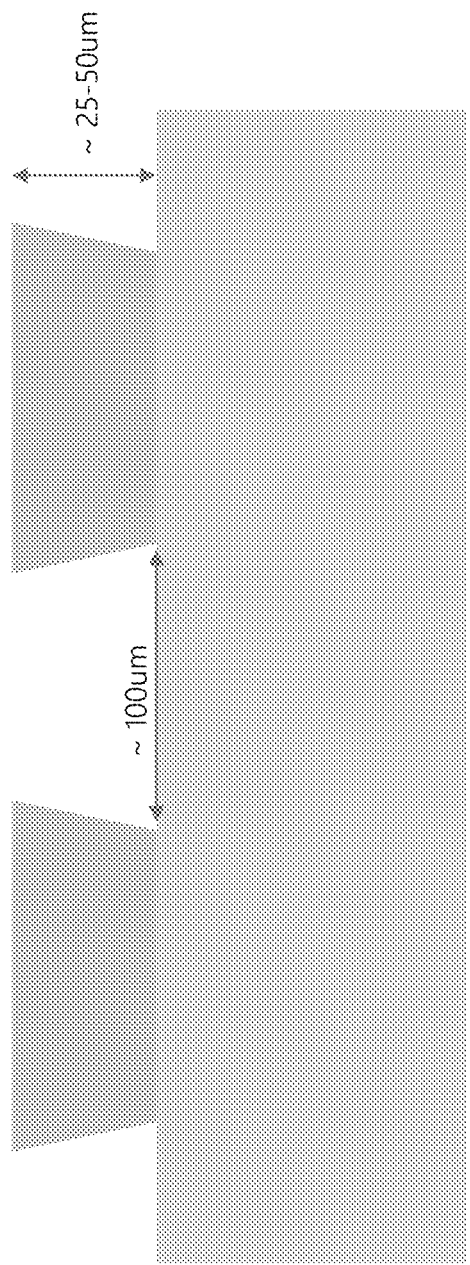
Figure 13:
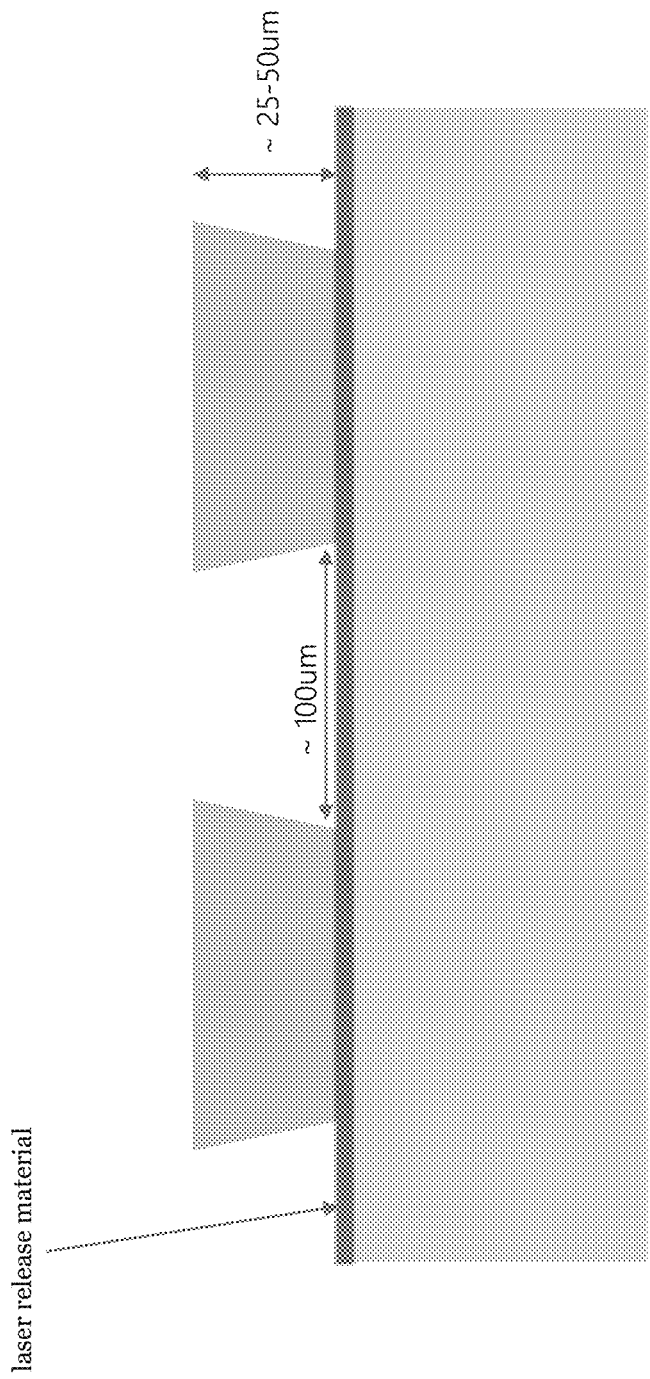
Figure 14:
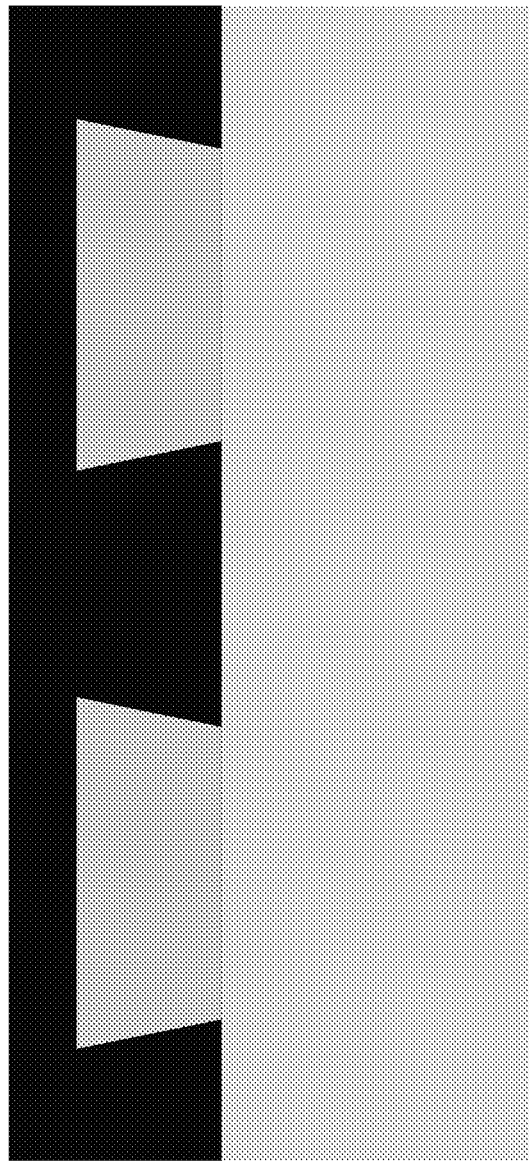
Figure 15:
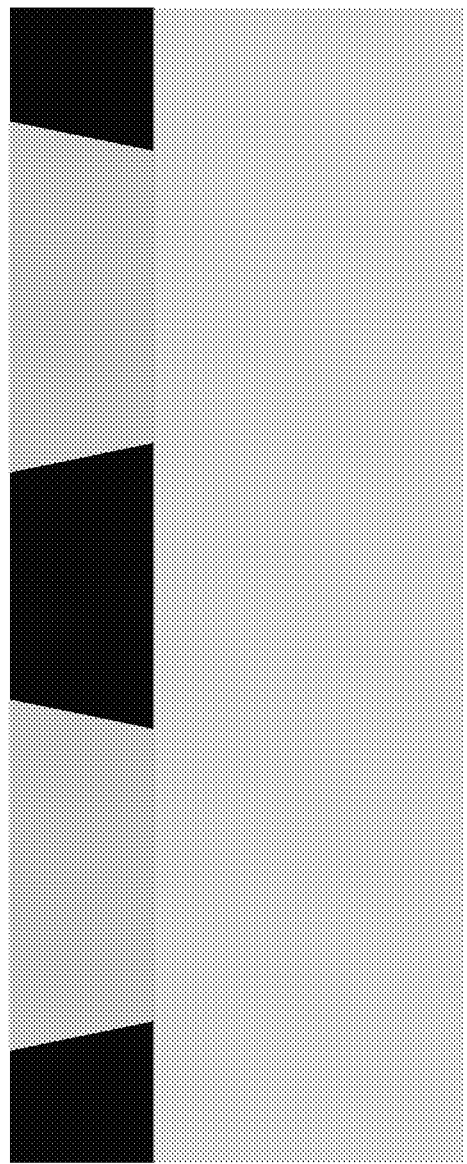
Figure 16:
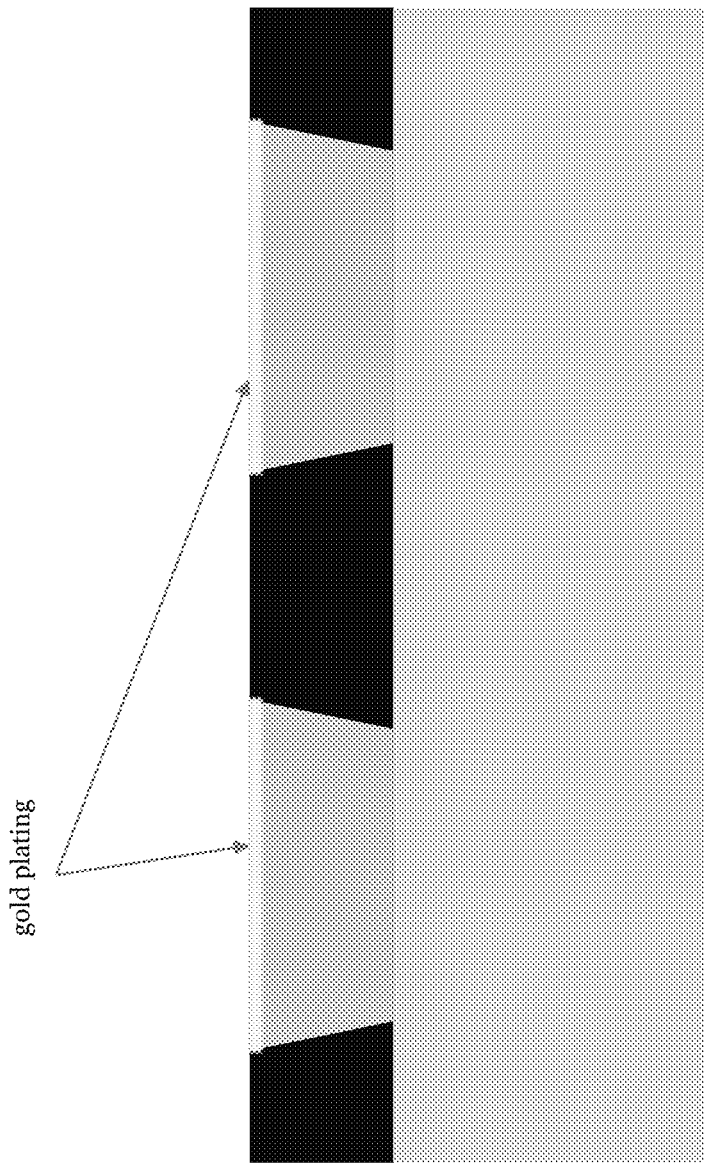
Figure 17:
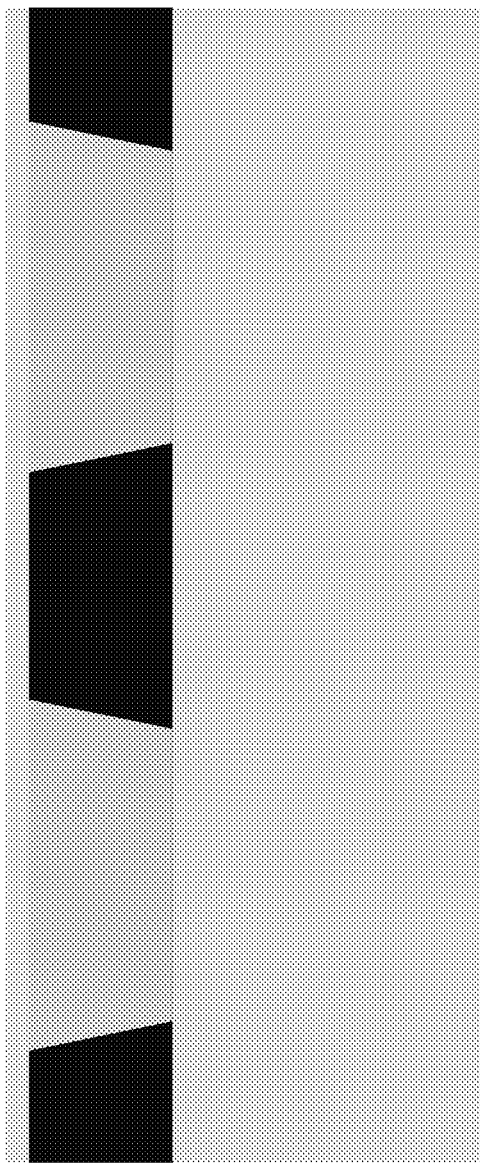
Figure 18:
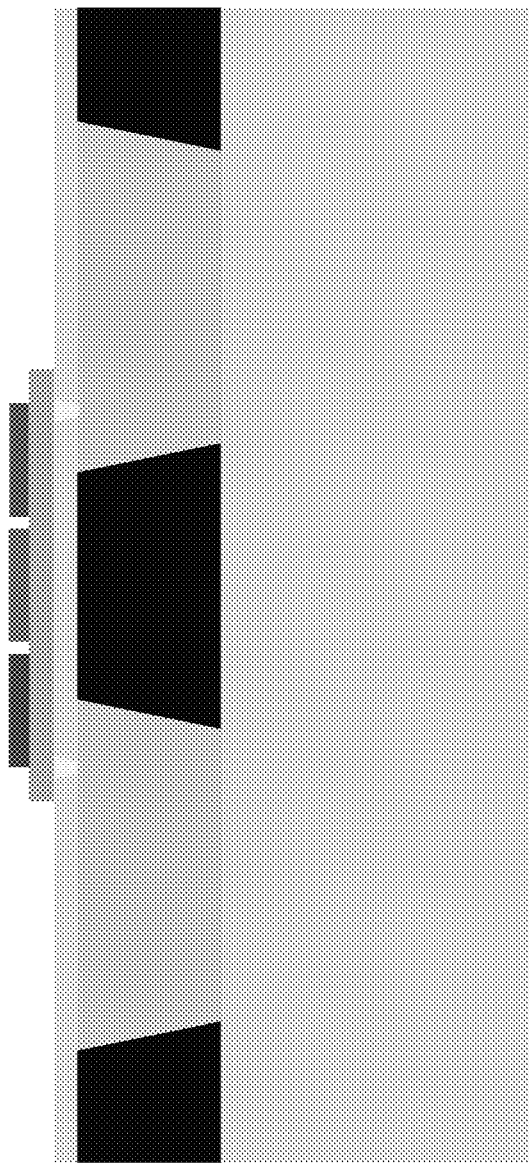
Figure 19:
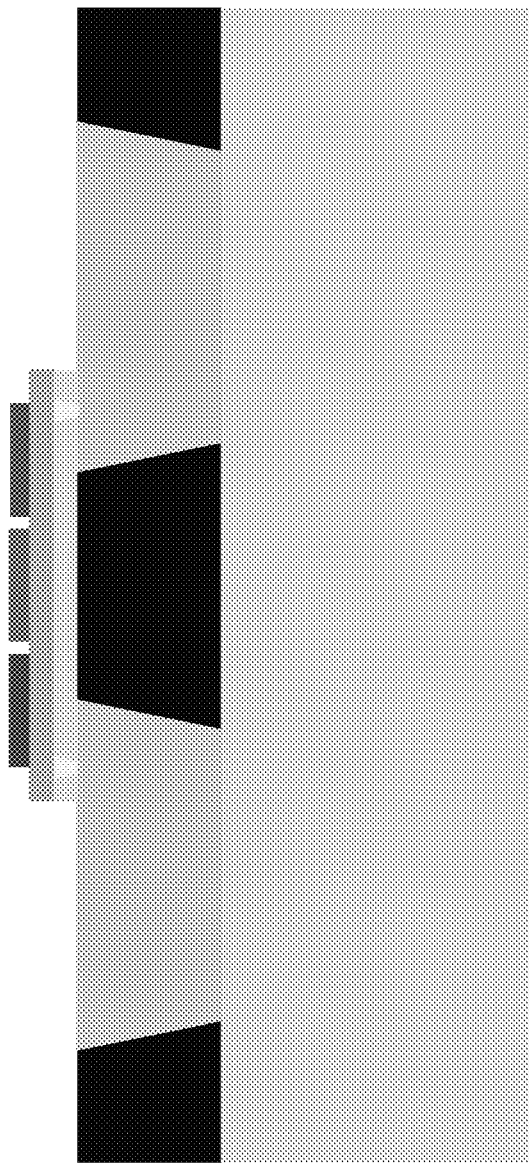
Figure 20:
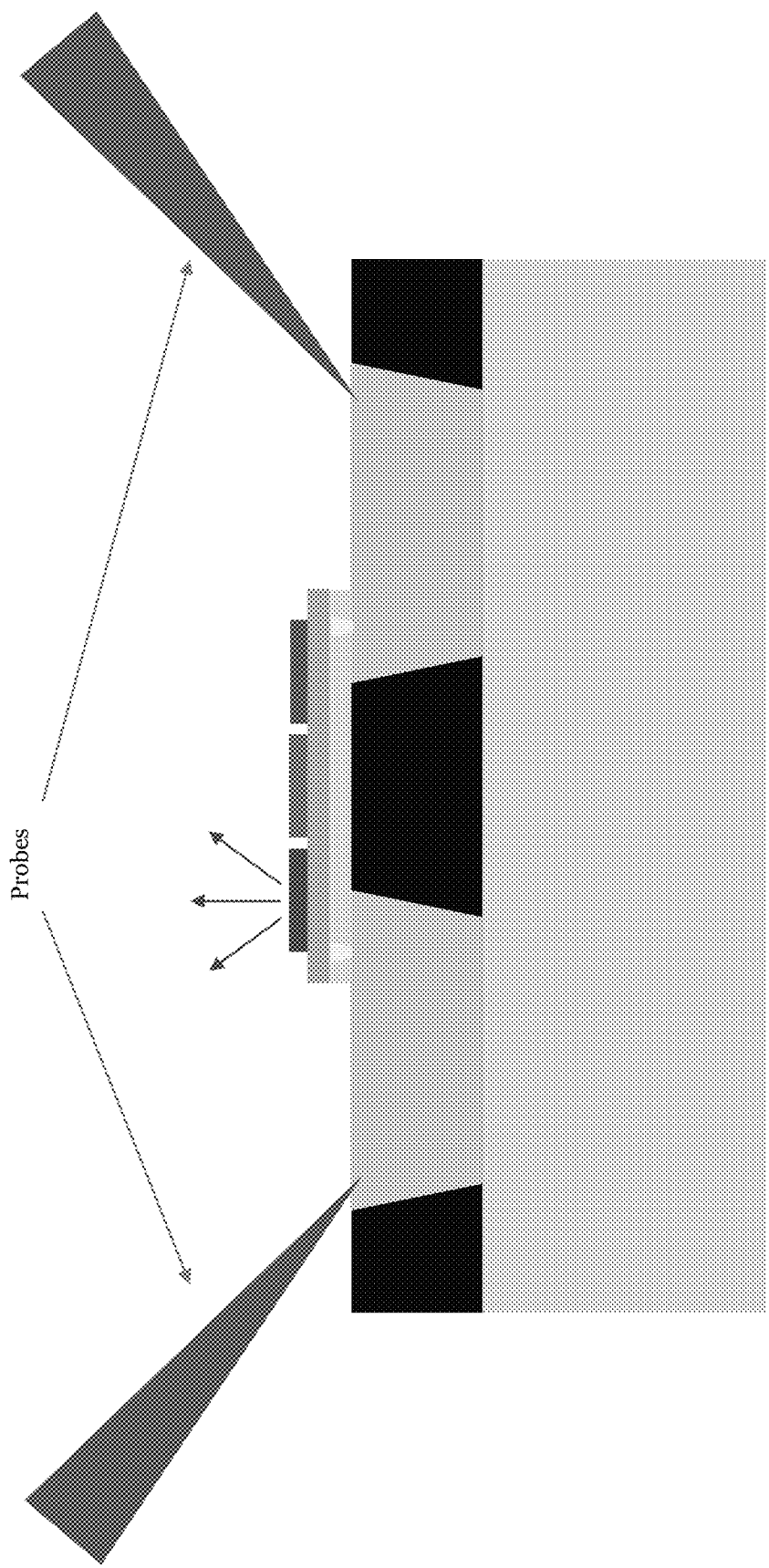
Figure 21:
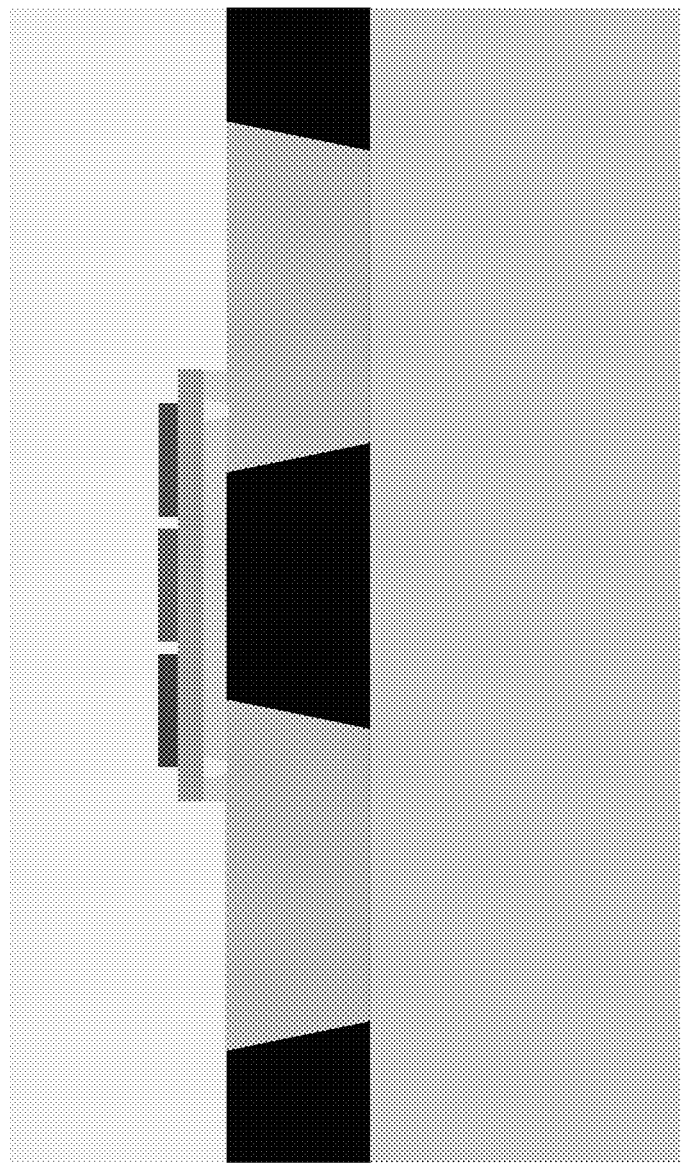
Figure 22:
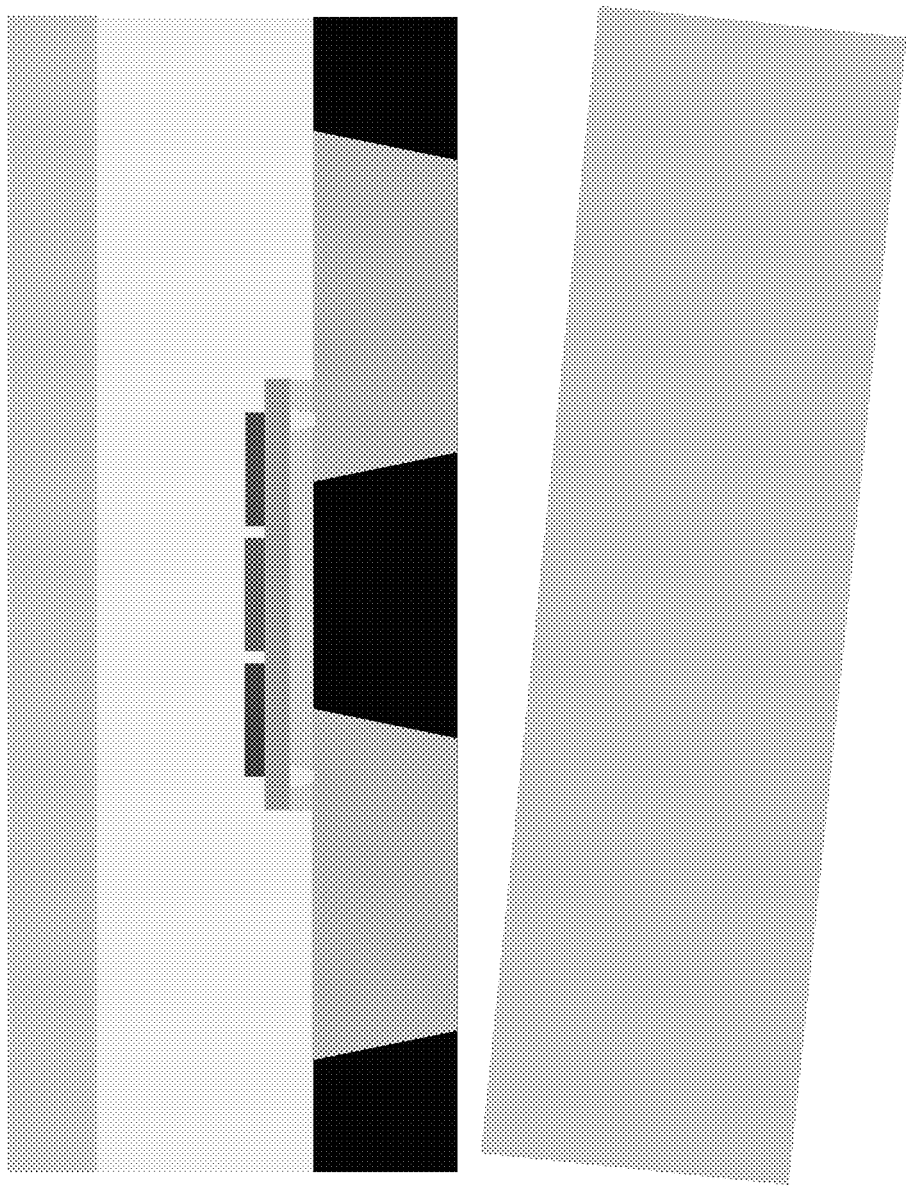
Figure 23:
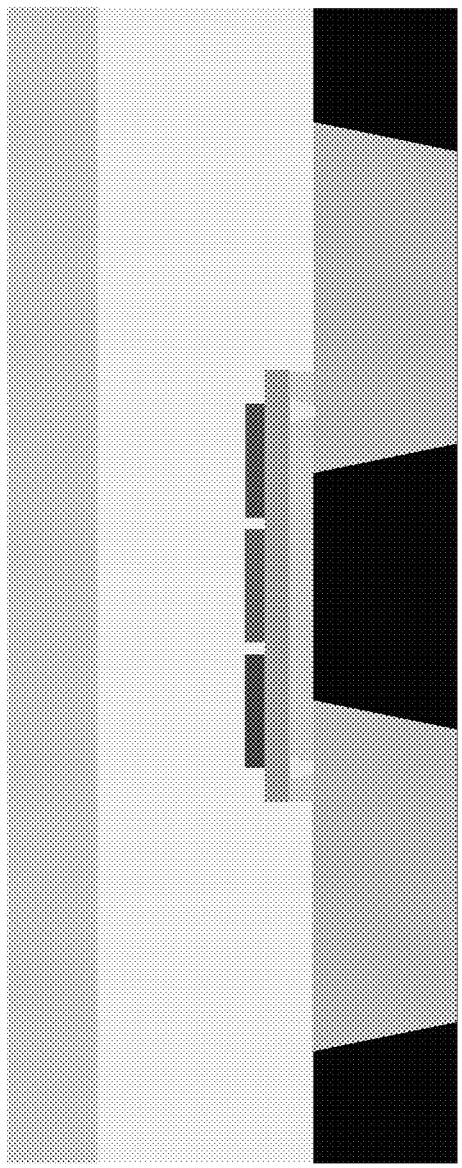
Figure 24:
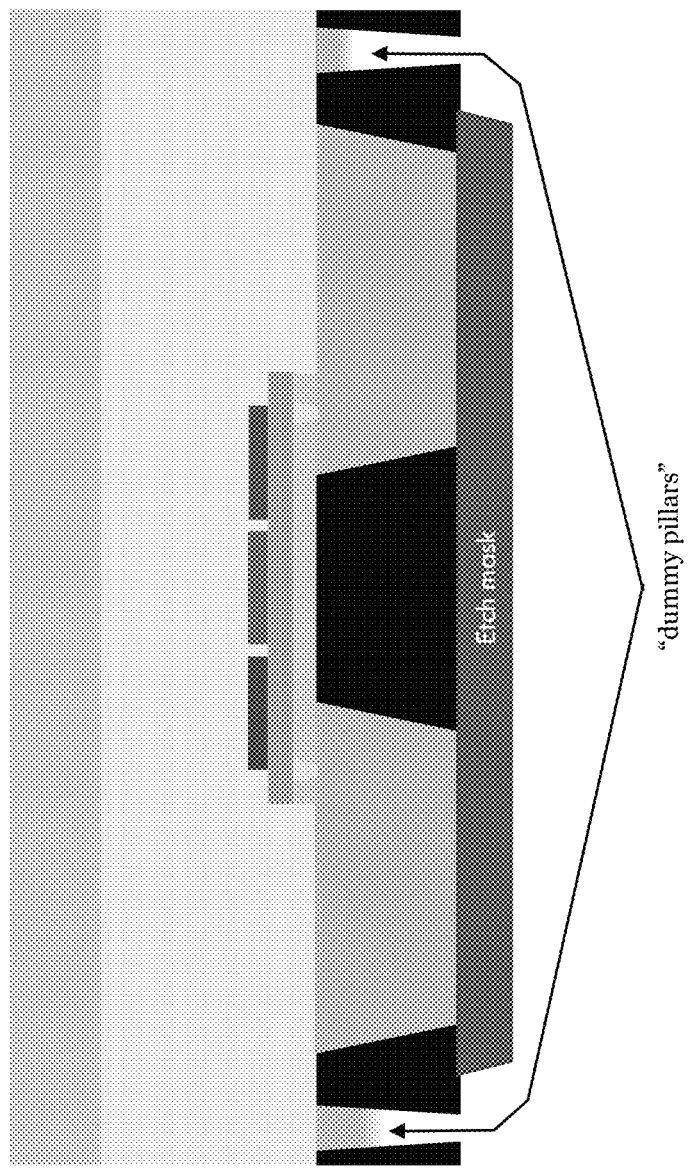
Figure 25:
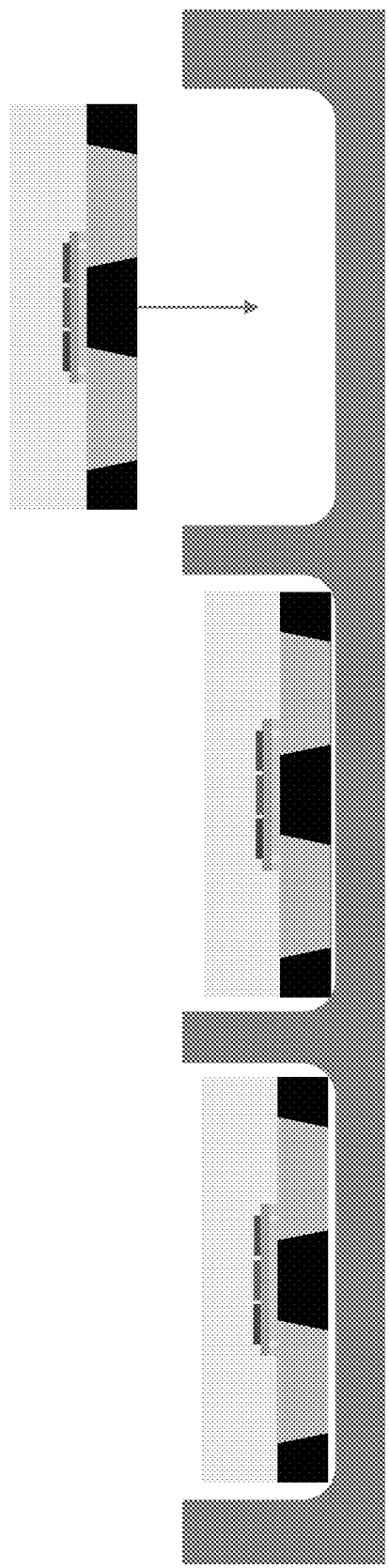
Figure 26:
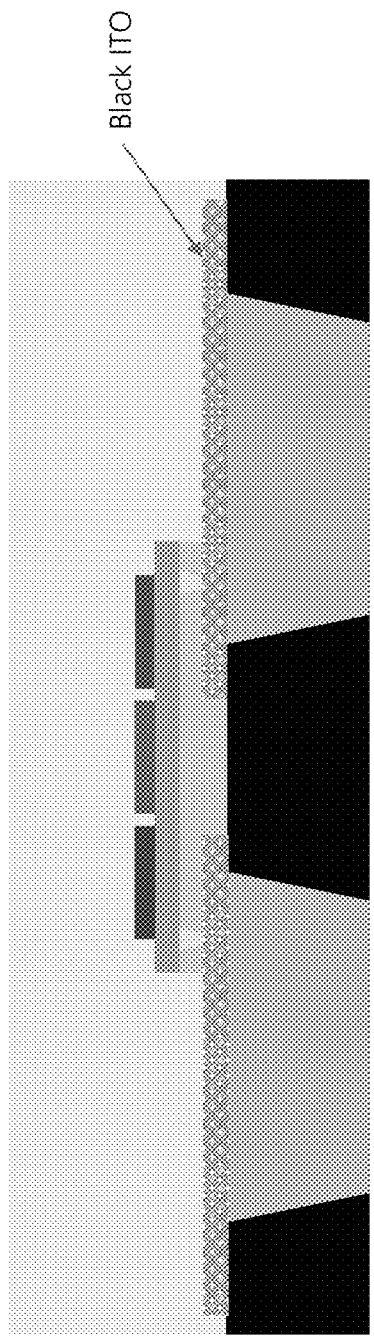
FIGS. 26-32 illustrate and describe certain embodiments of pixel packages and methods of making pixel packages, according to some illustrative embodiments of the present disclosure.

In some embodiments, a pixel package 60 as shown in FIG. 11 is a low-cost wafer-level package prepared using a process in accordance with FIGS. 12-25. First, form metal (Cu) pillars on a (e.g., 300 mm thick) glass wafer (FIG. 12). Optionally, laser release material (e.g., lift-off resist (e.g., that absorbs at 308 nm), chromium, polyimide, or light-to-heat conversion material) is applied prior to forming metal pillars (FIG. 13). Next, apply (black) molding compound (FIG. 14), and grind/polish to reveal the Cu pillars (FIG. 15). Optionally, after grinding/polishing, immersion gold plating can be used to produce a gold surface of metal (e.g., copper) pillars at planarized surface (FIG. 16). Next, apply a dielectric (e.g., polymer resin) (FIG. 17) and print (e.g., microtransfer print) pixel engines onto the wafer (FIG. 18). The pixel engines will be interconnected to the metal pillars through pressure-activated interconnections (e.g., with connection posts) (shown in FIG. 18). Next, the dielectric can be patterned (e.g., removed in the field) (FIG. 19) and pixel engines can be tested (FIG. 20). Next, an optically clear mold compound is applied (FIG. 21). The device layers are then laser transferred onto tape (FIG. 22) and then singulated (FIGS. 23-24). Photolithography can be used to singulate by protecting the metal pillars with an etch mask and "dummy pillars" formed to partially or fully isolate each package (FIG. 24). The known-good-die are then sorted into tape & reel or trays (FIG. 25). The package can be assembled onto wiring boards using conventional surface mount technology. A black matrix (e.g., black ITO) layer can be optionally formed during package fabrication (FIG. 26).

Figure 27:
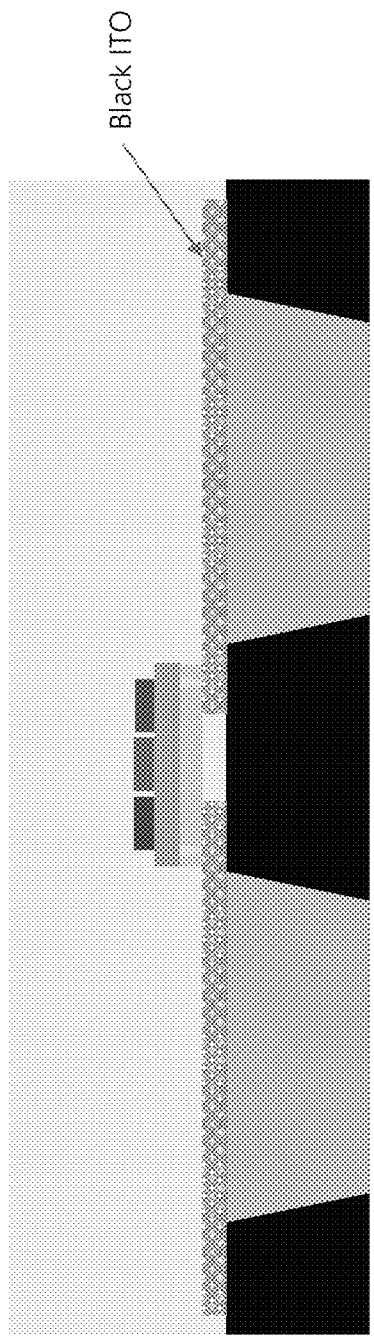
Figure 28:
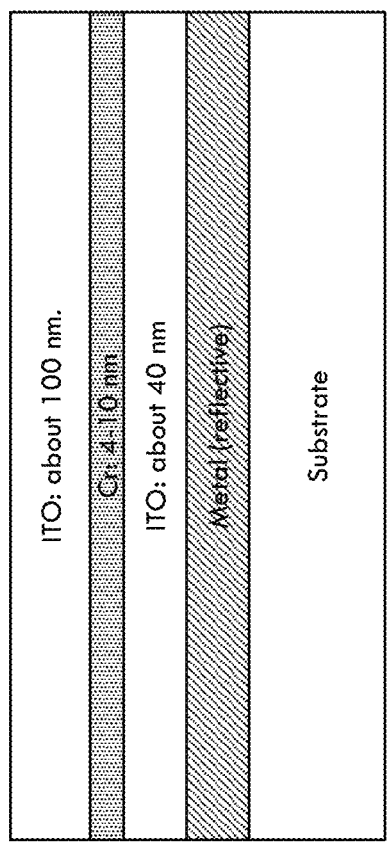

In some embodiments, as shown in FIG. 27, a package includes a smaller pixel engine, for example one that has at least one dimension (e.g., a length and/or a width) that is smaller than a separation distance between conductive pillars. The package can include a conductive layer (e.g., black ITO) that provides electrical connections between the conductive pillars and the pixel engine. A black matrix layer can be made using ITO (and referred to as "black ITO"). An example of a black matrix layer using ITO is shown in FIG. 28. Optical cavities are made out of ITO and trap light for absorption in partially transmissive metal (e.g., chromium) film.

Figure 29:
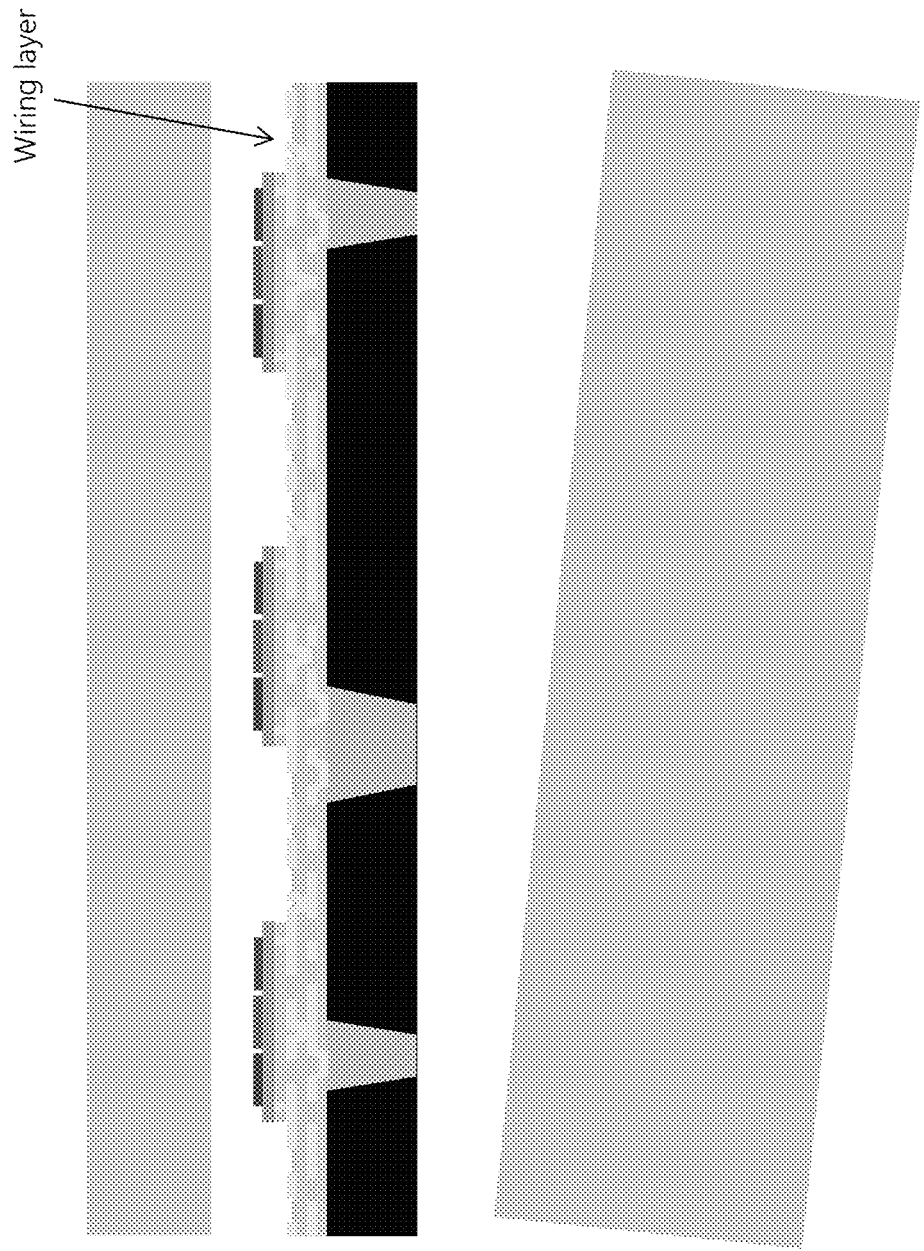

FIG. 29 shows an example of a display tile constructed similarly to a surface mount device. FIG. 29 is shown at the stage of separation of the original substrate. A structure as shown in FIG. 29 can be fabricated using the following steps. In a first step, a substrate (e.g., of glass) is provided. In a second step, conductive (e.g., copper) pillars are formed. In a third step, a molding compound is applied. In a fourth step, the conductive pillars are revealed using planarization (e.g., grinding/etching). In a fifth step, a wiring layer is formed, for example, by applying dielectric with vias; forming a first display circuit metal (e.g., wiring) level; applying a second dielectric with vias; and forming a display circuit metal (e.g., wiring) level. In a sixth step, pixel engines are printed and interconnected. In an optional seventh step, a clear encapsulation layer (e.g., of optically clear adhesive) is applied. In an eighth step, the original substrate is separated (e.g., by laser lift-off).

Figure 30:
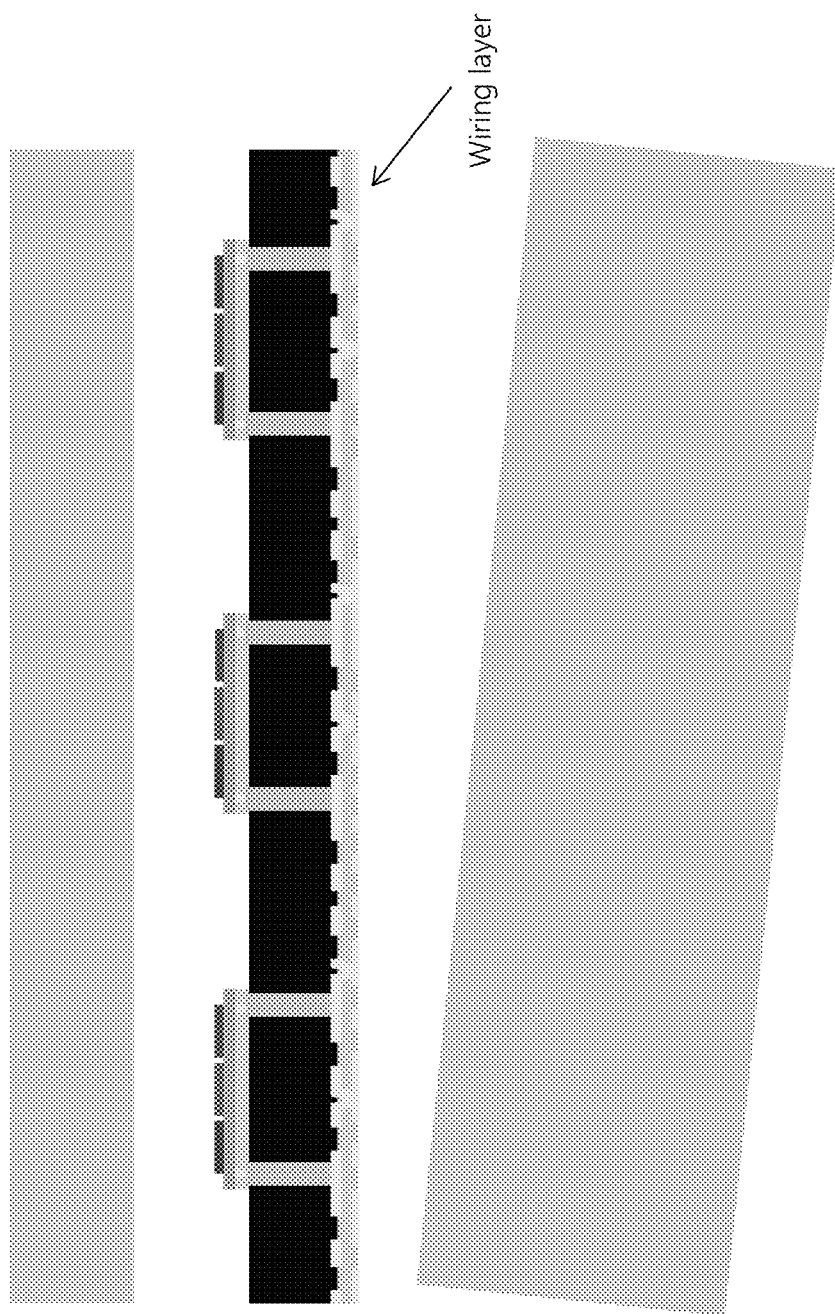

FIG. 30 shows an example of a display tile (e.g., constructed similarly to a surface mount device). FIG. 30 is shown at the stage of separation of the original substrate. A structure as shown in FIG. 30 can be fabricated using the following steps. In a first step, a substrate (e.g., of glass) is provided. In a step second, conductive (e.g., Cu) pillars are formed. In a third step, a molding compound is applied. In a third step, the conductive pillars are planarized (e.g., by grinding or etching). In a fourth step, a dielectric with vias is applied. In a fifth step, a wiring layer is formed, for example, by applying dielectric with vias; forming a first display circuit metal (e.g., wiring) level; applying a second dielectric with vias; and forming a display circuit metal (e.g., wiring) level. In a sixth step, pixel engines are printed and interconnected. In an optional seventh step, a clear encapsulation layer (e.g., of optically clear adhesive) is applied. In an eighth step, the original substrate is separated (e.g., by laser lift-off). In some embodiments, display wiring layer(s) and/or dielectric layer(s) are formed prior to conductive (e.g., copper) pillars such that the layer(s) are opposite the pixel engines, as shown in FIG. 30.

Figure 31:
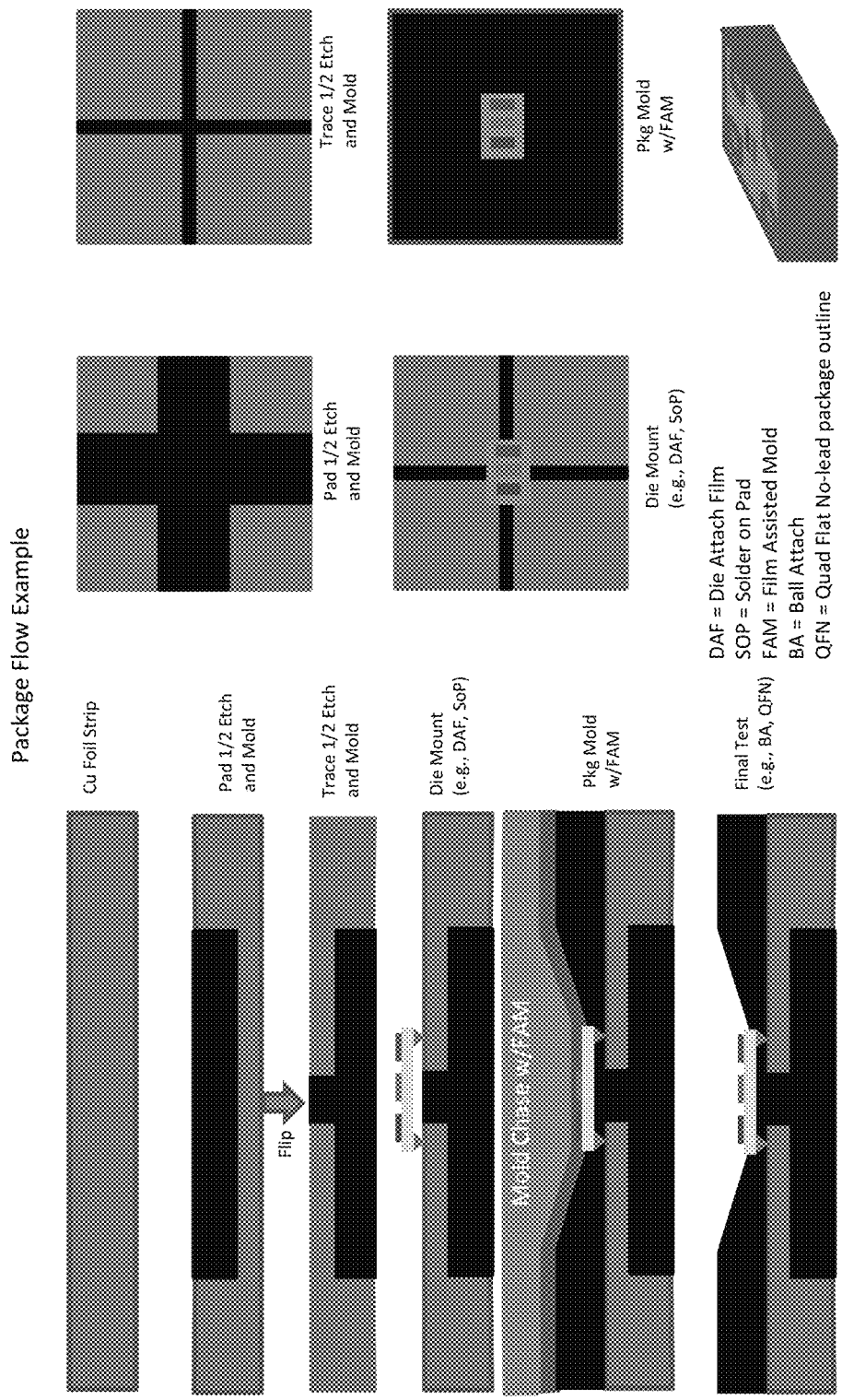

FIG. 31 shows a package flow example for packing a pixel engine.

Figure 32:
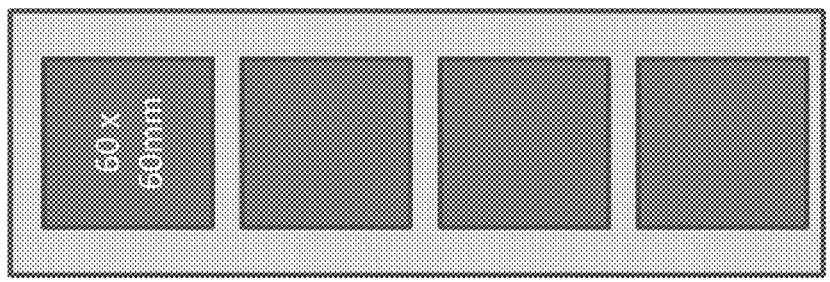

In some embodiments, for example as shown in FIG. 32, packages are provided in a routable molded (e.g., micro) lead frame (rtMLF) strip format. Packages may be provided in a standard strip format for compatibility with automated surface mount technology (SMT) equipment. For example, four square blocks of packages roughly 60 mm on a side may be provided. Singulation can be done on UV-release dicing tape.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the invention should not be limited to the expressly described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

PARTS LIST

P lateral separation of conductive pillars
S lateral separation of connection posts
10 substrate
12 substrate surface
14 release layer
16 substrate wiring layer
17 package wiring layer
18 conductive layer
20 conductive pillar
21 gold layer
22 insulating mold material
23 planarized surface
24 adhesive layer
26 patterned conductive layer
30 pixel engine
32 light emitter
32R red-light emitter
32G green-light emitter
32B blue-light emitter
33 pixel controller
34 tether
36 connection post
38 stamp
40 optically clear mold compound
42 tape
44 radiation
46 cut
50 reel
52 pocket
60 pixel package
70 wiring board/display substrate/printed circuit board
72 conductive traces/wires
90 probe
100 provide substrate step
105 optional provide release layer on substrate step
110 optional provide wiring layer on release/layer substrate step
115 coat substrate with conductor step
120 pattern conductor forming conductive pillars step
125 coat substrate and conductive pillars with insulating mold compound step
130 planarize insulating mold compound and conductive pillars exposing conductive pillars step
135 optional provide wiring layer on insulating mold compound and conductive pillars step
140 optional dispose adhesive layer on insulating mold compound and conductive pillars step
145 micro-transfer print light engine in electrical contact with exposed conductive pillars step
150 optional remove exposed adhesive step
155 test light engine through exposed conductive pillars step
160 dispose optically clear mold compound over light engine step
165 adhere tape to optically clear mold compound step
170 remove substrate step
175 singulate pixel packages step
180 transfer known-good pixel packages to reel or tray step
185 assemble known-good pixel packages to wiring board step

The invention claimed is:

1. A pixel engine package, comprising:
spaced-apart conductive pillars;
an insulating mold compound laterally disposed between the conductive pillars such that the conductive pillars and the insulating mold compound together define a planarized surface;
a pixel engine comprising connection posts disposed on the planarized surface with each of the connection posts in electrical contact with one of the conductive pillars; and
an optically clear mold compound disposed over the planarized surface and pixel engine,
wherein the pixel engine comprises a pixel-engine substrate and the pixel-engine substrate comprises a broken or separated tether.

2. The pixel engine package of claim 1, comprising a tape adhered to the optically clear mold compound on a side of the optically clear mold compound opposite the pixel engine.

3. The pixel engine package of claim 1, wherein the conductive pillars each comprise at least 50% copper.

4. The pixel engine package of claim 1, wherein the connection posts are laterally separated by a distance less than a lateral separation of the conductive pillars.

5. The pixel engine package of claim 1, wherein the insulating mold compound is substantially black.

6. The pixel engine package of claim 1, comprising insulating mold compound laterally disposed in a common layer with the pixel engine.

7. The pixel engine package of claim 1, wherein the pixel engine comprises a pixel controller.

8. The pixel engine package of claim 7, wherein the one or more light emitters each comprise a broken or separated tether.

9. The pixel engine package of claim 1, wherein the pixel engine comprises two or more light emitters that emit different colors of light.

10. The pixel engine package of claim 9, wherein the light emitters are inorganic micro-light-emitting diodes (LEDs) comprising inorganic LEDs having at least one of a length and a width that is not greater than 200 microns.

11. The pixel engine package of claim 1, comprising a wiring layer disposed in electrical contact with the conductive pillars and in electrical contact with the pixel engine.

12. The pixel engine package of claim 11, wherein the wiring layer is disposed on the planarized surface between the pixel engine and the conductive pillars and insulating mold compound.

13. The pixel engine package of claim 11, wherein the wiring layer is disposed on a side of the conductive pillars and insulating mold compound opposite the planarized surface.

14. The pixel engine package of claim 11, wherein the wiring layer comprises substantially black ITO.

15. The pixel engine package of claim 14, wherein the substantially black ITO comprises layers of ITO interspersed by one or more layers of chromium.

16. The pixel engine package of claim 14, comprising a reflective layer disposed between the substantially black ITO and a side of the conductive pillars and insulating mold compound opposite the planarized surface.

17. A pixel engine package, comprising:
spaced-apart conductive pillars;
an insulating mold compound laterally disposed between the conductive pillars such that the conductive pillars and the insulating mold compound together define a planarized surface;
a pixel engine comprising connection posts disposed on the planarized surface with each of the connection posts in electrical contact with one of the conductive pillars;
an optically clear mold compound disposed over the planarized surface and pixel engine; and
a release layer disposed on a side of the conductive pillars and insulating mold compound opposite the planarized surface.

18. A pixel engine package, comprising:
spaced-apart conductive pillars;
an insulating mold compound laterally disposed between the conductive pillars such that the conductive pillars and the insulating mold compound together define a planarized surface;
a pixel engine comprising connection posts disposed on the planarized surface with each of the connection posts in electrical contact with one of the conductive pillars; and
an optically clear mold compound disposed over the planarized surface and pixel engine,
wherein the conductive pillars comprise a gold layer that forms a portion of the planarized surface.

* * * * *